United States Patent [19]
Ota et al.

[11] Patent Number: 5,416,562
[45] Date of Patent: May 16, 1995

[54] METHOD OF DETECTING A POSITION AND APPARATUS THEREFOR

[75] Inventors: Kazuya Ota, Tokyo; Hideo Mizutani, Yokohama, both of Japan

[73] Assignee: Nikon Corporation, Tokyo, Japan

[21] Appl. No.: 264,841

[22] Filed: Jun. 22, 1994

Related U.S. Application Data

[63] Continuation of Ser. No. 90,576, Jul. 12, 1993, which is a continuation-in-part of Ser. No. 24,743, Mar. 2, 1993, abandoned.

[30] Foreign Application Priority Data

| Mar. 6, 1992 | [JP] | Japan | 4-84760 |
| Jul. 14, 1992 | [JP] | Japan | 4-210798 |
| Jul. 17, 1992 | [JP] | Japan | 4-213458 |
| Aug. 12, 1992 | [JP] | Japan | 4-236472 |

[51] Int. Cl.$^6$ .............................................. G03B 27/42
[52] U.S. Cl. ............................................ 355/53; 355/67
[58] Field of Search ................................. 355/53, 67, 71

[56] References Cited

U.S. PATENT DOCUMENTS

| 4,845,530 | 7/1989 | Matsukura | 355/53 |
| 4,908,656 | 3/1990 | Suwa et al. | 355/53 |
| 5,049,925 | 9/1991 | Alton et al. | 355/53 |
| 5,101,226 | 3/1992 | Beaulieu et al. | 355/53 |
| 5,137,349 | 8/1992 | Taniguchi et al. | 355/53 |
| 5,291,239 | 3/1994 | Jackson | 355/53 |
| 5,361,122 | 11/1994 | Kataoka et al. | 355/53 |

*Primary Examiner*—Monroe H. Hayes
*Attorney, Agent, or Firm*—Shapiro and Shapiro

[57] ABSTRACT

An apparatus for detecting the position, in a predetermined direction normal to a substrate, of at least one measurement point in a detection area on the substrate, includes:

a projection device for projecting a light-dark pattern consisting of a repetitive pattern of light and dark portions in a predetermined detection direction onto substantially the entire detection area;

a photoelectric detection device for detecting reflection light from the substrate, and outputting a photoelectric signal having a waveform representing the contrast of an image of the light-dark pattern in the detection direction;

a device for detecting the position of a waveform representing a dark portion of the light-dark pattern corresponding to the measurement point in the waveform of the photoelectric signal; and a measurement device for measuring the position, in the predetermined direction, of the measurement point based on a deviation between the detected waveform position and a predetermined reference position.

17 Claims, 26 Drawing Sheets

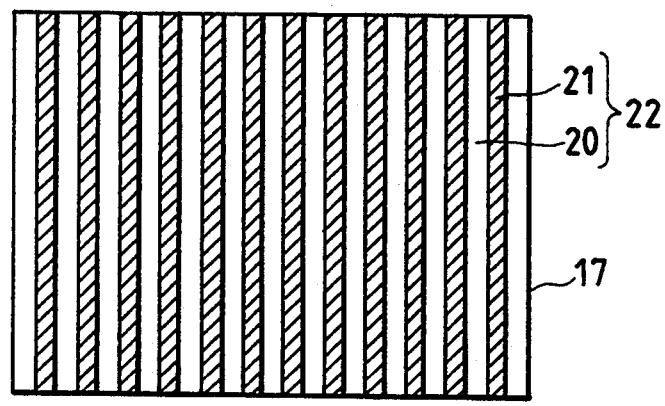
FIG. 6A
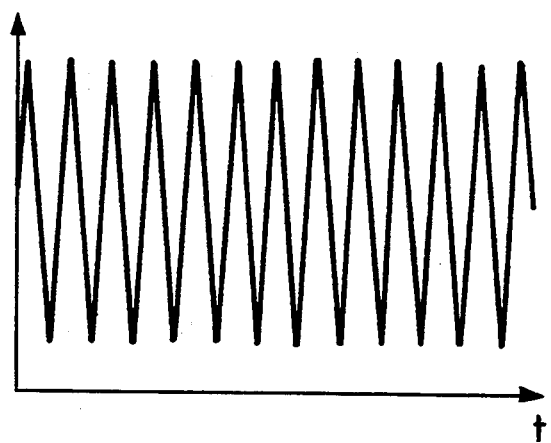
FIG. 6B
FIG. 7A
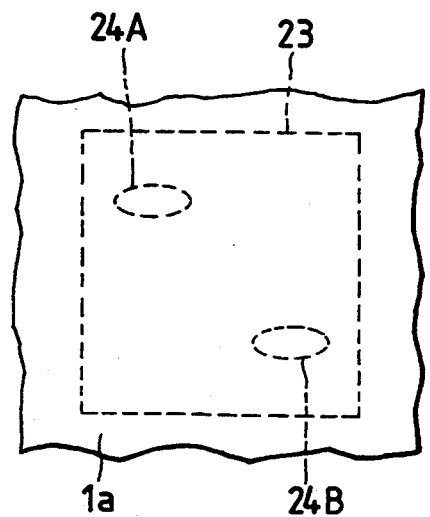
FIG. 7B
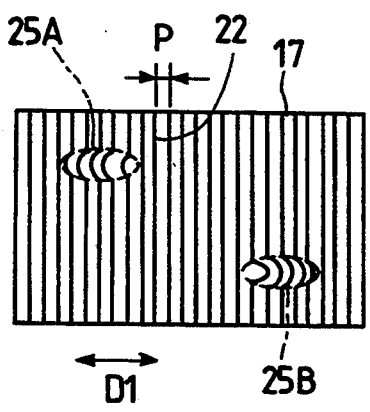

59A  71  54 53  59B
         55

METHOD OF DETECTING A POSITION AND APPARATUS THEREFOR

This is a continuation of application Ser. No. 08/090,576 filed Jul. 12, 1993, which is a continuation-in-part of application Ser. No. 08/024,743 filed Mar. 2, 1993, now abandoned.

BACKGROUND OF THE INVENTION

1. Field of the Invention

The present invention relates to a method of detecting a position and an apparatus therefor which are suitable for use in an auto-focusing mechanism of an exposure apparatus used in a lithography process to manufacture a semiconductor device or a liquid crystal device, or a leveling mechanism.

2. Related Background Art

In a projection type exposure apparatus for transferring a circuit pattern formed on a reticle onto a wafer through a projection optical system, the focal depth of the projection optical system has been reduced to a very small value as the microminiaturization of the circuit pattern progresses. Thus, an auto-focusing (AF) system disclosed in Japanese Laid-Open Patent Application No. 56-42205 or U.S. Pat. No. 4,558,949 is used to detect a deviation of a wafer surface from a preset virtual reference plane (which substantially coincides with a focal plane of the projection optical system) with respect to the optical axis direction of the projection optical system to finely drive the wafer in the optical axis direction of the projection optical system to attain focusing. In this AF system, a slit pattern image is obliquely projected onto a predetermined point in a shot area on the wafer without passing through the projection optical system and a reflection image thereof is photoelectrically detected by a synchronous detection system. This system is usually called a fixed point AF system. Normally, since the circuit pattern formed in the shot area on the wafer includes many linear patterns extending along the X and Y directions, the slit pattern image is inclined on the wafer by 45° with respect to the X and Y directions so that the linear patterns cross the slit pattern image. In this manner, the reduction of the measurement precision of the AF system due to the circuit pattern on the wafer is prevented.

As described above, in the fixed point AF system, the deviation of the focal plane from the wafer surface is not directly detected. Thus, if the virtual reference plane shifts from the focal plane of the projection optical system by a drift or the like, or if the focal plane shifts by a change in focusing characteristics of the projection optical system due to absorption of exposing light, the shift appears as a residual focus offset when the pattern is projected and exposed on the wafer. A method for reducing the residual focus offset is disclosed in U.S. Pat. No. 4,650,983, U.S. Pat. No. 4,629,313, and U.S. Pat. No. 4,952,815. In U.S. Pat. No. 4,650,983, a reference pattern is provided on a stage (holder) on which the wafer is mounted, and the reference pattern is reverse-projected onto a specific pattern on the reticle through the projection optical system. The level of the stage is adjusted such that the contrast of the image of the reference pattern formed on the specific pattern is maximum. Thereafter, the AF system is calibrated such that a plane on which the reference pattern is formed is detected by the AF system as a best focus plane (best focal plane). In U.S. Pat. No. 4,629,313, a slit-shaped photosensor is used as a reference pattern on the stage, and the contrast of a pattern image when a slit pattern on the reticle is projected by the projection optical system is detected to determine the best focal plane. In U.S. Pat. No. 4,952,815, a slit-shaped light-emitting mark is provided on the stage, and the image of the light-emitting mark is reverse-projected onto a specific mark on the reticle. Then, the stage is driven in the X and Y directions and light transmitted above the reticle when the specific mark is scanned by the light-emitting mark is photoelectrically detected to detect the best focal plane.

Since there is a partial step in each shot area on the wafer, it is difficult for the fixed point AF system to make the entire plane of the shot area to coincide with the focal plane of the projection optical system. The projection type exposure apparatus is also provided with a leveling sensor disclosed in U.S. Pat. No. 4,558,949 but it is difficult to exactly detect the gradient of the shot area which includes the step. A method for attaining high degree of focusing over the entire plane of the shot area is disclosed in U.S. Pat. No. 5,118,957, in which a pinhole image is obliquely projected onto each of a plurality of (for example, five) points in the shot area on the wafer without passing through the projection optical system, and reflected images therefrom are collectively sensed by a two-dimensional position detection device (CCD). This method is commonly called as an oblique projection multi-point AF system and it can attain focus detection and gradient detection with a high precision.

An assignee of the present application has also filed U.S. patent application Ser. No. 964,954 (on Oct. 22, 1992) which relates to a plane level detection apparatus for detecting a level (a position along an optical axis) at each of a plurality of points in the shot area in order to attain high degree of focusing over the entire plane of the shot area. In the prior art multi-point AF system, a plurality of measurement points are fixed in the shot area, but in the apparatus of the application filed by the present assignee, the number and positions of the measurement points can be readily changed in accordance with the step structure in the shot area so that the level at any point in the shot area can be detected. The plane level detection apparatus proposed by the present assignee will now be explained with reference to FIG. 5.

FIG. 5 shows a projection type exposure apparatus having the plane level detection apparatus proposed by the present assignee. A projection optical system 5 transfers a circuit pattern of a reticle (not shown) to an exposure surface (a surface of a resist layer) 1a of a wafer 1. A wafer holder (θ table) 2 for holding the wafer 1 is mounted on a wafer stage 3 which is two-dimensionally driven by a drive means 4 in a plane perpendicular to an optical axis AX1 of the projection optical system 5. The wafer holder 2 is finely movable along the optical axis of the projection optical system 5 and tiltable in any direction on the wafer stage 3. The drive means 4 drives the wafer holder 2 in accordance with a command from a correction amount calculation means 19 to attain focusing and leveling of the wafer 1.

The detailed arrangement of the oblique projection type plane level detection system will now be explained. Referring to FIG. 5, illumination light from a light source 6 is substantially collimated by a condenser lens 7 and is incident on a reflection type phase grating plate 8, which has a phase grating formed on its grating formation surface 8a by steps which extend parallelly to the plane of the drawing at a pitch Q1. Usually, the surface of the wafer 1 is covered by a photoresist. In order to reduce an affect of a thin film interference, it is desirable that the light source 6 is a white light source (for example, a halogen lamp). However, a light-emitting diode which emits light having a wavelength band which is of low sensitivity to the resist may be used as the light source 6.

A focusing lens 9 and a projection objective lens 10 form a projection optical system, and an optical axis AX2 of the projection optical system crosses the optical axis AX1 of the projection optical system 5 with an angle $\theta$. Reflected (including diffracted light) having a mean reflection angle $\gamma$, from the grating formation surface 8a is focused on the surface 1a to be examined of the wafer 1 by the projection optical system (9 and 10). The construction is such that when the plane 1a coincides with the best focal plane of the projection optical system 5, that is, in an in-focus state, the surface 1a and the grating formation surface 8a meet a shine-proof condition with respect to the projection optical system (9 and 10). Accordingly, in the in-focus state, the image of the grating pattern of the grating formation surface 8a is correctly focused on the entire surface 1a. The projection optical system (9 and 10) is a bi-telecentric optical system and any point on the grating formation surface 8a and a conjugate point on the surface 1a have the same magnification over the entire surface. Accordingly, since the grating pattern of the grating formation surface 8a in FIG. 5 is an equi-interval diffraction grating having a longitudinal direction along a direction perpendicular to the plane of drawing, the image projected onto the surface 1a is also an equi-interval grating pattern having a longitudinal direction along the direction perpendicular to the plane of the drawing.

A light-receiving objective lens 11 and a focusing lens (imaging lens) 12 form a focusing optical system which focuses reflected light from the surface 1a to a dump correction diffraction grating plate 13. An optical axis AX3 of the focusing optical system (the lenses 11 and 12) is symmetric to the optical axis AX2 of the projection optical system (9 and 10) with respect to the optical axis AX1 of the projection optical system. A phase type grating pattern having steps extending parallelly to the plane of drawing of FIG. 5 at a pitch Q2 is also formed on a grating formation surface 13a of the diffraction grating plate 13. The grating pattern has a predetermined blaze angle, as will be described later. The construction is such that when the surface 1a coincides with the focal plane of the projection optical system 5, the surface 1a and the grating formation surface 13a meet a shine-proof condition with respect to the focusing optical system (11 and 12). Accordingly, in the in-focus state, the image of the grating pattern on the surface 1a is correctly refocused on the entire grating formation surface 13a. The focusing optical system (11 and 12) is also a bi-telecentric optical system, and any point on the surface 1a and a conjugate point on the grating formation surface 13a have the same magnification over the entire surface. Accordingly, when the surface 1a coincides with the focal plane of the projection optical system 5, the image projected onto the grating formation surface 13a is also an equi-interval grating pattern having a longitudinal direction along a direction perpendicular to the plane of drawing.

As described above, in FIG. 5, when the surface 1a coincides with the focal plane of the projection optical system 5, the grating formation surface 8a, the surface 1a, and the grating formation surface 13a meet the shine-proof condition and the magnification on each plane is equal over the entire plane.

Light incident on the diffraction grating plate 13 is diffracted by the grating pattern. The pitch of the grating pattern of the diffraction grating plate 13 is determined such that a principal light beam of the reflected light is substantially parallel to a normal direction to the grating formation surface 13a. The reflected light from the grating formation surface 13a is focused on a light-receiving surface 17a of a two-dimensional charge coupled image pickup device (CCD) 17 through a lens 14, a plane mirror 15, and a lens 16. In this manner, the image of the grating pattern formed on the grating formation surface 13a is refocused on the light-receiving surface 17a. A relay optical system formed by the lenses 14 and 16 is also a bi-telecentric system.

The image formed on the light-receiving surface 17a is produced by relaying twice the image of the grating pattern of the reflection type phase grating plate 8 projected onto the surface 1a. In other words, it is a double refocused image of the pattern image projected on the surface 1a. Since the principal light beam of the reflected light from the diffraction grating plate 13 is substantially perpendicular to the grating formation surface 13a, the principal light beam incident on the CCD 17 is also substantially perpendicular to the light-receiving surface 17a. Since the image of the pattern projected onto the surface 1a is double refocused on the light-receiving surface 17a, the grating pattern image on the light-receiving surface 17a shifts laterally when the surface 1a moves along the optical axis of the projection optical system 5. Accordingly, the plane position along the optical axis AX1 on the surface 1a can be measured by measuring the lateral shift.

More specifically, when the surface 1a is planar, a fringe (light-dark pattern) 22 having light portions 20 and dark portions 21 at a predetermined pitch is focused on the light-receiving surface of the CCD 17, as shown in FIG. 6A. An image pickup signal (voltage) which is an average of image pickup signals along the pitch direction of the fringe 22 within a predetermined range is large in an area corresponding to the light portion 20 and small (close to zero) in an area corresponding to the dark portion 21, as shown in FIG. 6B. As shown in FIG. 7A, if there are a recessed portion 24A and a projected portion 24B in an area (broken line) 23 onto which the light-dark pattern is projected on the surface 1a, the phase of the fringe 22 partially changes on the light-receiving surface of the CCD 17. Namely, as shown in FIG. 7B, the phase of the fringe 22 changes in areas 25A and 25B, corresponding to the recessed portion 24A and the projected portion 24B, on the light-receiving surface of the CCD 17. Accordingly, the position of the entire surface 1a along the optical axis of the projection optical system 5 can be detected by detecting the phases of the respective portions of the fringe 22.

Referring back to FIG. 5, the image pickup signal from the CCD 17 is supplied to a detection unit 18. The detection unit 18 processes the image pickup signal (FIG. 7B) to detect a pattern image on the light-receiving surface 17a, and supplies pattern information to the correction amount calculation means 19. The correction amount calculation means 19 determines a deviation between the surface 1a and the focal plane of the projection optical system 5 based on the pattern information, and controls the drive of the wafer holder 2 through the drive means 4 such that the surface 1a, that is, the entire shot area falls within the focal depth of the projection optical system 5.

When a displacement of the surface 1a along the optical axis AX1 is z, the lateral shift y of the fringe (light-dark pattern image) on the light-receiving surface of the CCD 17 is given by the following formula:

$$y = 2 \cdot \beta'' \cdot \beta' \cdot \tan\theta \cdot z \qquad (1)$$
$$= 2 \cdot \beta''(\beta^2\sin^2\theta + \beta^4\sin^4\theta/\cos^2\theta)^{\frac{1}{2}} \cdot z$$

where $\theta$ is the incident angle of the principal light beam of the illumination light to the surface 1a, $\beta$ is the lateral magnification of the focusing optical system (11 and 12), $\beta'$ is the magnification along a focal plane of the dump from the surface 1a to the grating formation surface 13a, and $\beta''$ is the lateral magnification of the relaying optical system (14 and 16).

A function of the dump correction diffraction grating plate 13 will now be described. For example, when the lateral magnification $\beta$ of the focusing optical system (11 and 12) is 0.5 and the incident angle $\theta$ is 85°, an incident angle $\alpha$ of the principal light beam of the reflected light from the surface 1a with respect to the diffraction grating plate 13 is approximately 80°. With such a large incident angle, the intensity of incident light is considerably reduced if the CCD 17 is directly arranged in place of the diffraction grating plate 13, because the light incident on the photoelectric conversion portion of the CCD is eclipsed by a peripheral read circuit portion, and surface reflection of the photoelectric conversion portion and a window glass of the CCD package is so large that the light is not effectively incident on the light-receiving portion. Thus, an optical element to reduce the incident angle to the CCD is required. In FIG. 5, it is attained by using 1st-order diffracted light from the diffraction grating plate 13.

In FIG. 5, the diffraction grating plate 13 is used as the dump correction optical member. Alternatively, a prism 13' in FIG. 8 may be used. The plane level detection system shown in FIG. 8 will now be explained. The same reference numerals in FIG. 8 denote the same parts as in FIG. 5, and an explanation thereof will be omitted.

In FIG. 8, reflected light from the surface 1a is focused onto an incident surface 13'a of the prism 13' through the light-receiving objective lens 11, a plane mirror 15A, and the focusing lens 12. When the surface 1a coincides with the focal plane of the projection optical system 5, the surface 1a and the incident surface 13a meet the shine-proof condition with respect to the focusing optical system (11 and 12). Accordingly, in the in-focus state, the image of the grating pattern on the surface 1a is correctly refocused on the entire incident surface 13'a. The refractive index of a glass material of the prism 13' is selected such that the principal light beam of the light refracted by the prism 13' is substantially parallel to the normal direction to the incident surface 13'a. The light beam emerging from the prism 13' is focused on the light-receiving surface 17a of the two-dimensional CCD 17 through a plane mirror 15B and the relay lenses 14 and 16. The principal light beam of the light emerging from the prism 13' is substantially normal to the incident surface 13'a or has a small refraction angle. Accordingly, the principal light beam of the light incident on the two-dimensional CCD 17 is also substantially normal to the light-receiving surface 17a or has a small incident angle $\rho$.

According to the arrangement shown in FIG. 5 or 8, the position detection is attained at arbitrary point in the predetermined range (light-dark pattern area) on the surface 1a. However, circuit patterns of preceding layers have already been formed on the surface 1a, and the image of the circuit pattern may be superimposed on the fringe 22 of FIG. 6A on the light-receiving surface of the CCD 17. Thus, when a peak of the image pickup signal of FIG. 6B is detected as in the prior art, a partial phase change of the fringe 22 cannot be correctly detected, and a detection error occurs.

The fringe (light-dark pattern image) 22 focused on the light-receiving surface of the CCD 17 is a periodic pattern at a pitch P, as shown in FIG. 7B. For this reason, if the lateral shift (phase shift) amount of the fringe 22 in the pitch direction (a D1 direction in FIG. 7B) is represented by $\Delta y$, the detection range of the lateral shift amount $\Delta y$ satisfies, e.g., the following relation:

$$-P/2 \leq \Delta y < P/2$$

If the position shift amount of the surface 1a in the optical axis direction of the projection optical system 5 when the lateral shift amount $\Delta y$ of the fringe 22 satisfies $\Delta y = P$ is represented by $Z_P$, when the lateral shift amount $\Delta y$ exceeds $\pm P/2$, the detection result (the position shift amount of the surface 1a) includes an error of $n \times Z_P$ (n is an integer). This means that the plane level detection system shown in FIG. 5 or 8 has a narrow detection range, in the optical axis direction, of the surface 1a. Therefore, when the level of the surface 1a is detected using the plane level detection system shown in FIG. 5 or 8, the surface 1a must be caused to fall within the detection range in advance using another level detection means, e.g., an air micrometer or the like, and the detection system is undesirably complicated very much.

In the above-mentioned plane level detection system, the relative displacement, in the height direction, of the surface 1a can be detected from the lateral shift amount of the light-dark fringe 22 on the light-receiving surface 17a of the CCD 17. In particular, in the projection type exposure apparatus (FIG. 5 or 8), the position shift amount of the surface to be examined (wafer surface) with respect to the best focal plane of the projection optical system 5 must be detected. Thus, in a state wherein a reference surface on a reference member provided to the wafer stage 3 is caused to coincide with the best focal plane of the projection optical system 5, a light-dark pattern is projected onto the reference surface, the position of the pattern image (light-dark fringe) on the light-receiving surface of the CCD 17 is detected, and the position of the light-dark fringe is stored in advance as a reference position. When the surface of the wafer 1 is caused to coincide with the best focal plane of the projection optical system 5, the position of the pattern image focused on the light-receiving surface of the CCD 17 when the light-dark pattern is projected onto the wafer 1 is compared with the above-mentioned reference position to detect the lateral shift amount of the pattern image (light-dark fringe) with respect to the above-mentioned reference position, thus detecting the position shift amount of the wafer surface with respect to the best focal plane of the projection optical system 5.

However, it is very difficult to calibrate the above-mentioned plane level detection system, i.e., to detect the reference position of the light-dark fringe using the reference surface of the reference member. More specifically, since the above-mentioned fixed point or multi-point AF system for projecting a slit pattern (or pinhole) image on the surface to be examined has a very small pattern image projection area on the surface to be examined, the reference surface of the reference member to be used in calibration can be small, and the flatness of the reference surface does not pose any problem. In contrast to this, since the above-mentioned plane level detection system projects the light-dark pattern on the wide area (having an area as large as that of the shot area on the wafer) 23 on the surface 1a, as shown in FIG. 7A, it requires a reference surface having an area as large as that of the area 23. Although the flatness of such a wide reference surface is important, it is difficult to process the reference surface to a perfectly smooth surface free from steps.

Furthermore, when the best focal plane of the projection optical system 5 is not a flat plane but is deformed to a curved plane due to aberrations such as a curvature of field, the reference surface must also be processed to the same curved surface as the best focal plane. However, such a process is further difficult to attain. In addition, the best focal plane of the projection optical system 5 may gradually deform further due to aging (e.g., exposing light absorption), the above-mentioned reference surface cannot cope with such aging. Therefore, the above-mentioned calibration method of the plane level detection system cannot correctly detect the reference position of the light-dark fringe, i.e., cannot sufficiently reduce a residual focus offset.

SUMMARY OF THE INVENTION

The present invention has been made in consideration of the above situation, and has as its first object to provide a method of detecting a position and an apparatus therefor, which can detect the level of a surface to be examined with a high precision even when a circuit pattern or the like is formed on the surface to be examined. It is the second object of the present invention to provide a position detection apparatus, which can precisely detect the level of a surface to be examined even when the phase shift of a periodic pattern image (pitch P) refocused on the light-receiving surface of an image pickup means exceeds ±P/2. Furthermore, it is the third object of the present invention to provide a method of detecting a position and an apparatus therefor, which can precisely detect the position shift amount at an arbitrary point within a projection area with respect to a predetermined reference plane (e.g., the best focal plane of a projection optical system) even when the projection area of a light-dark pattern on a surface to be examined is wide.

In order to achieve the first object of the present invention, a position detection apparatus comprises means (6, 40, 41) for projecting a repetitive pattern (55) of light and dark portions with respect to a predetermined detection direction (R direction) onto a substantially entire area (area 52) of a detection area (50) on a substrate (1), photoelectric detection means (42, 18) for detecting reflected light from the substrate, and outputting a photoelectric signal having a waveform representing a contrast of the image of the light-dark pattern with respect to the detection direction, means (45, 46) for detecting a position in the waveform of the photoelectric signal which represents a dark portion (54) of the light-dark pattern corresponding to a measurement point in the detection area, and calculation means (19) for calculating a point along a direction normal to the substrate (a direction substantially along an optical axis AX of a projection optical system 5) at the measurement point within the detection area based on a deviation between the detected position of the waveform and a predetermined reference position.

Also, in order to achieve the first object of the present invention, in a first position detection method, the light-dark pattern (55) is projected onto the detection area (50) on the substrate (1), the reflected light from the substrate is received to detect the waveform representing the image contrast along the direction of arrangement (R direction) of the light-dark pattern, and the level at the measurement point within the detection area is determined based on a deviation between the position of the waveform representing the dark portion (54) of the light-dark pattern corresponding to the measurement point in the detection area in the detected waveform, and the predetermined reference position.

As described above, the position at an arbitrary point within the detection area can be detected because the image of the light-dark pattern is partially distorted, that is, the waveform of the image pickup signal from the photoelectric detection means is partially shifted if there is a step in the detection area on the substrate. When a circuit pattern has been formed within the detection area, the photoelectric detection means picks up the image of the circuit pattern, too, because the circuit pattern is illuminated with the light-dark pattern projected onto the detection area. In the present invention, it has been noticed that the image of the circuit pattern which is present within the area corresponding to the dark portion of the light-dark pattern image is scarcely observed by the photoelectric detection means, and the position detection is performed using the waveform corresponding to the dark portion of the light-dark pattern image, of the waveform of the image pickup signal. Thus, even if a circuit pattern is present within the detection area, the reduction of the position detection precision due to the circuit pattern is prevented. If the light-dark pattern projected onto the substrate is a high-contrast grating pattern, the image processing is facilitated, and the precision of measurement of the position using the light-dark pattern is improved.

In order to achieve the first object of the present invention, a second position detection method uses a movable stage (35X, 35Y) on which the substrate (1) is placed, drive means (4) for driving the movable stage, light transmission means (6, 40, 41) for projecting a light-dark pattern onto the substrate from an oblique direction with respect to a predetermined axis (Z axis), image pickup means (42) for picking up the image of the projected light-dark pattern, and processing means (46) for detecting the lateral shift amount of the picked-up pattern image. The image of the light-dark pattern projected onto the substrate is picked up by the image pickup means in a state wherein the movable stage is moved in a direction perpendicular to the predetermined axis (Z axis) by the drive means, and the position of the substrate in the direction of the predetermined axis (Z axis) is detected on the basis of the lateral shift amount of the picked-up pattern image.

Furthermore, in order to achieve the first object of the present invention, a third position detection method comprises: the first step of picking up the image of the light-dark pattern projected onto the substrate using the image pickup means (42) in a state wherein the movable stage (35X, 35Y) is moved in the direction perpendicular to the predetermined axis (Z axis) by the drive means (4), and storing the position of the substrate in the direction of the predetermined axis (Z axis) obtained from the lateral shift amount of the picked-up pattern image; the second step of picking up the image of the light-dark pattern projected onto the substrate using the image pickup means (42) in a state wherein the movable stage stands still, and storing the position of the substrate in the direction of the predetermined axis (Z axis) obtained from the lateral shift amount of the picked-up pattern image; and the third step of obtaining a difference (offset) between the position stored in the first step and the position stored in the second step. After the offset is obtained, the position of the substrate in the direction of the predetermined axis (Z axis) obtained from the lateral shift amount of the picked-up pattern image picked up in the state wherein the movable stage stands still is corrected using the difference (offset) obtained in the third step.

As described above, according to the second position detection method, even when the substrate is moved along a plane perpendicular to the predetermined axis (Z axis), the position of the light-dark pattern image on the image pickup surface is left unchanged. In contrast to this, when a circuit pattern or the like has already been formed on the substrate, if the substrate is moved along the plane perpendicular to the Z axis, the image of the circuit pattern on the substrate moves on the image pickup surface. Therefore, when the substrate is moved (or vibrated) in the direction perpendicular to the Z axis during the image pickup operation of the light-dark pattern image, a conjugate image of the circuit pattern formed on the substrate also moves (or vibrates) on the image pickup surface of the image pickup means, and its edge is blurred. For this reason, upon detection of the position of the light-dark pattern on the image pickup surface, the influence of the circuit pattern or the like on the substrate can be eliminated, and position detection of the substrate can be precisely performed.

Furthermore, the third position detection method is effective for sequentially detecting the levels of a large number of processing areas on the substrate, and is particularly suitably applied to a projection type exposure apparatus. More specifically, the first and second steps are executed on the first processing area on the substrate, and a difference between the position detection result obtained when the substrate is moved, and the position detection result obtained when the substrate stands still is stored as an offset. A circuit pattern or the like, which has already formed on each of a large number of processing areas on the substrate is normally common, and the influence of the circuit pattern to the position detection result is also common on any processing area. Thus, on the second and subsequent processing areas, the position detection of the substrate is performed in only the state wherein the substrate stands still (i.e., only the second step is executed), and the stored offset is added to this position detection result. Therefore, the position detection in a state wherein the substrate is moved need only be performed on only one processing area on the substrate, and the position detection in a state wherein the substrate stands still can be performed for subsequent areas. For this reason, position detection in units of processing areas can be precisely and quickly executed.

In order to achieve the second object of the present invention, a position detection apparatus comprises light transmission means for projecting a light-dark pattern which has a repetitive portion formed with a non-repetitive portion onto a substrate from an oblique direction with respect to a predetermined axis (Z axis), image pickup means for picking up an image of the projected light-dark pattern, first processing means for detecting a lateral shift amount of a portion corresponding to the repetitive portion in the picked-up pattern image, and second processing means for detecting a position of a portion corresponding to the non-repetitive portion in the picked-up pattern image, wherein the position of the substrate in the direction of the predetermined axis (Z axis) is detected on the basis of the position detected by the second processing means, and the lateral shift amount detected by the first processing means. In this case, the non-repetitive portion in the light-dark pattern may be formed by removing a portion of the repetitive portion.

According to the above-mentioned position detection apparatus, the first processing means detects the lateral shift amount of the portion corresponding to the repetitive portion in the pattern image on the image pickup surface. For example, if the portion corresponding to the repetitive portion is a grating pattern having a pitch P in the X direction, and the magnification of a lateral shift amount $\delta x$, in the X direction, of this grating pattern with respect to a position z, in the Z direction, of the substrate surface is $\Omega(=\delta x/z)$, the position z of the substrate surface can be calculated as $\delta x/\Omega$ within a range in which the lateral shift amount $\delta x$ does not exceed $\pm P/2$ (range P).

In order to detect if the lateral shift amount $\delta x$ exceeds the range P, the second processing means detects a position $x'$, in the X direction, of the portion corresponding to the non-repetitive portion. In this case, for example, if the position z of the substrate surface is set to be almost zero when the position $x'$ is at the predetermined origin on the image pickup surface of the image pickup means ($x'=0$), the position $x'$ can be directly used as the lateral shift amount of the grating pattern as a whole. The position, in the Z direction, of the substrate is adjusted, so that the position $x'$ of the portion corresponding to the non-repetitive portion falls within a range of, e.g., $\pm P/2$ from the origin. In this manner, the position z, in the Z direction, of the substrate surface can be precisely detected from the lateral shift amount $\delta x$, in the X direction, of the grating pattern.

Note that an approximate value of the position z, in the Z direction, of the substrate surface can be obtained as $x'/\Omega$ from the position $x'$, in the X direction, of the portion corresponding to the non-repetitive portion even when the position, in the Z direction, of the substrate is not adjusted, so that the position $x'$ falls within the range of $\pm P/2$ from the origin. The exact value of the position z is given by $(\delta x + nP)/\Omega$ (n is an integer), and when a value $n^*$ of the integer n, which is the closest to $x'/\Omega$, is obtained, the exact value of the position z of the substrate surface is given by $(\delta x + n^* \cdot P)/\Omega$. More specifically, as long as the non-repetitive portion having a feature different from that of the repetitive portion falls within the range of the image pickup surface of the image pickup means, the position z, in the Z direction, of the substrate surface can be precisely detected even when the lateral shift amount of the picked-up pattern image exceeds the above-mentioned range P ($\pm P/2$).

When the light-dark pattern to be projected onto the substrate is constituted by the repetitive portion and the non-repetitive portion, as described above, the non-repetitive portion can be easily formed by removing a portion of the repetitive portion. Furthermore, when the non-repetitive portion in the light-dark portion corresponds to the end portion of the repetitive portion, the light-dark pattern can be easily formed.

As described above, since the non-repetitive portion is formed in the light-dark pattern to be projected onto the substrate, the position of the substrate can be precisely detected by detecting the position of the portion corresponding to the non-repetitive portion of the picked-up pattern image even when the pattern image is laterally shifted on the image pickup surface beyond the repetition interval (pitch). Even when the portion corresponding to the non-repetitive portion falls outside the image pickup surface, the substrate can be vertically moved, so that the portion corresponding to the non-repetitive portion falls within the image pickup surface. Therefore, another auto-focusing mechanism for compensating for position detection is not required.

In order to achieve the third object of the present invention, in a position detection method, a light-dark pattern projected onto a substrate is divided into a large number of partial areas, and the above-mentioned calibration is performed in units of the divided partial areas. At this time, a reference member having an area almost equal to that of each of these partial areas is prepared, and the surface of the reference member is used as a reference surface. For this reason, the surface of the reference member can be easily processed to have a state perpendicular to a predetermined axis (Z axis), and free from steps. More specifically, in this method, a projection area of the light-dark pattern is divided into a plurality of partial areas, the reference member (reference surface) is moved to each of the divided partial areas, and image pickup means picks up an image of the light-dark pattern, and the picked-up image is stored, thereby detecting the reference position of the image of the light-dark pattern corresponding to each of the partial areas with a high precision. Thus, the reference position of the image of the light-dark pattern can be detected and set with a high precision over the entire projection area of the light-dark pattern on the substrate like in a case wherein a reference surface, which has an area large enough to cover the entire projection area of the light-dark pattern, and is free from steps, is used.

When the reference position of a pattern image is obtained in units of a plurality of partial areas using the reference member, the reference member is moved in the direction of the predetermined axis (Z axis), so that its surface coincides with a predetermined reference target plane (e.g., the best focal plane of a projection optical system). At this time, even when the target plane is curved or is inclined from a plane perpendicular to the predetermined axis, since a single partial area has a small area, and it can be regarded that the surface of the reference member substantially coincides with the target plane, the reference position of the image of the light-dark pattern in the partial area corresponding to the target plane can be precisely detected. An approximate plane of the target plane may be calculated in advance by a least square method in consideration of the curvature of the target plane, and the surface of the reference member may be caused to coincide with the approximate plane. This method is effective when the target plane suffers from a large curvature. In another method, to reduce the influence of the curvature of the target plane, a single partial area may be still divided into a plurality of areas, and the reference position of the pattern image on the image pickup plane may be obtained in units of divided areas. When this method is adopted, the size of each partial area can be determined in consideration of the curvature of the target plane when the projection area of the light-dark pattern on the substrate is divided into a plurality of partial areas. At this time, the size of each partial area must be set to be equal to or smaller than that of the surface (reference surface) of a reference member having a high flatness. When the target plane (or its approximate plane) is inclined from a plane perpendicular to the predetermined axis, the reference member may be inclined, so that its surface becomes almost parallel to the target plane (or its approximate plane). Furthermore, the reference member may be moved in the direction of the predetermined axis, so that the surface of the reference member precisely coincides with the target plane (or its approximate plane).

In order to achieve the third object of the present invention, another position detection method comprises the first step of moving a surface of a reference member to a projection area of a light-dark pattern; the second step of storing, as an offset, a difference between a predetermined reference position and a position of a pattern image obtained by picking up an image of the light-dark pattern projected onto the surface of the reference member using image pickup means; the third step of moving the reference pattern within the projection area of the light-dark pattern; and the fourth step of storing, as a corrected reference position, a position obtained by correcting, with the offset, a position of the pattern image obtained by picking up the image of the light-dark pattern projected onto the surface of the reference member moved in the third step using the image pickup means. After the substrate is moved and set within the projection area of the light-dark pattern, the image of the light-dark pattern projected onto the substrate is picked up by the image pickup means, and a position, in the direction of the predetermined axis (Z axis), of the substrate is detected on the basis of a shift amount from the reference position of the picked-up pattern image or the corrected reference position.

According to the above-mentioned position detection method, the surface of the reference member need not always be flat. More specifically, in the first and second steps, a difference between the position of the image of the light-dark pattern corresponding to the surface of the reference member and an original image position is stored as an offset. In the third and fourth steps, the surface of the reference member is moved to another partial area in the projection area of the light-dark pattern, and the position of the image of the light-dark pattern is detected using the moved surface. Thereafter, the detected position of the image is corrected with the stored offset, thus obtaining a corrected reference position. Upon repetition of the third and fourth steps, the reference position of the pattern image corresponding to the entire projection area of the light-dark pattern can be set.

BRIEF DESCRIPTION OF THE DRAWINGS

FIG. 6A is a view showing an image focused on the light-receiving surface of a two-dimensional CCD shown in FIG. 5, and FIG. 6B is a chart showing a waveform of an image pickup signal corresponding to an image shown in FIG. 6A;

FIGS. 7A and 7B are views for explaining a principle of detection of the plane level detection system shown in FIG. 5;

DESCRIPTION OF THE PREFERRED EMBODIMENTS

Figure 1:
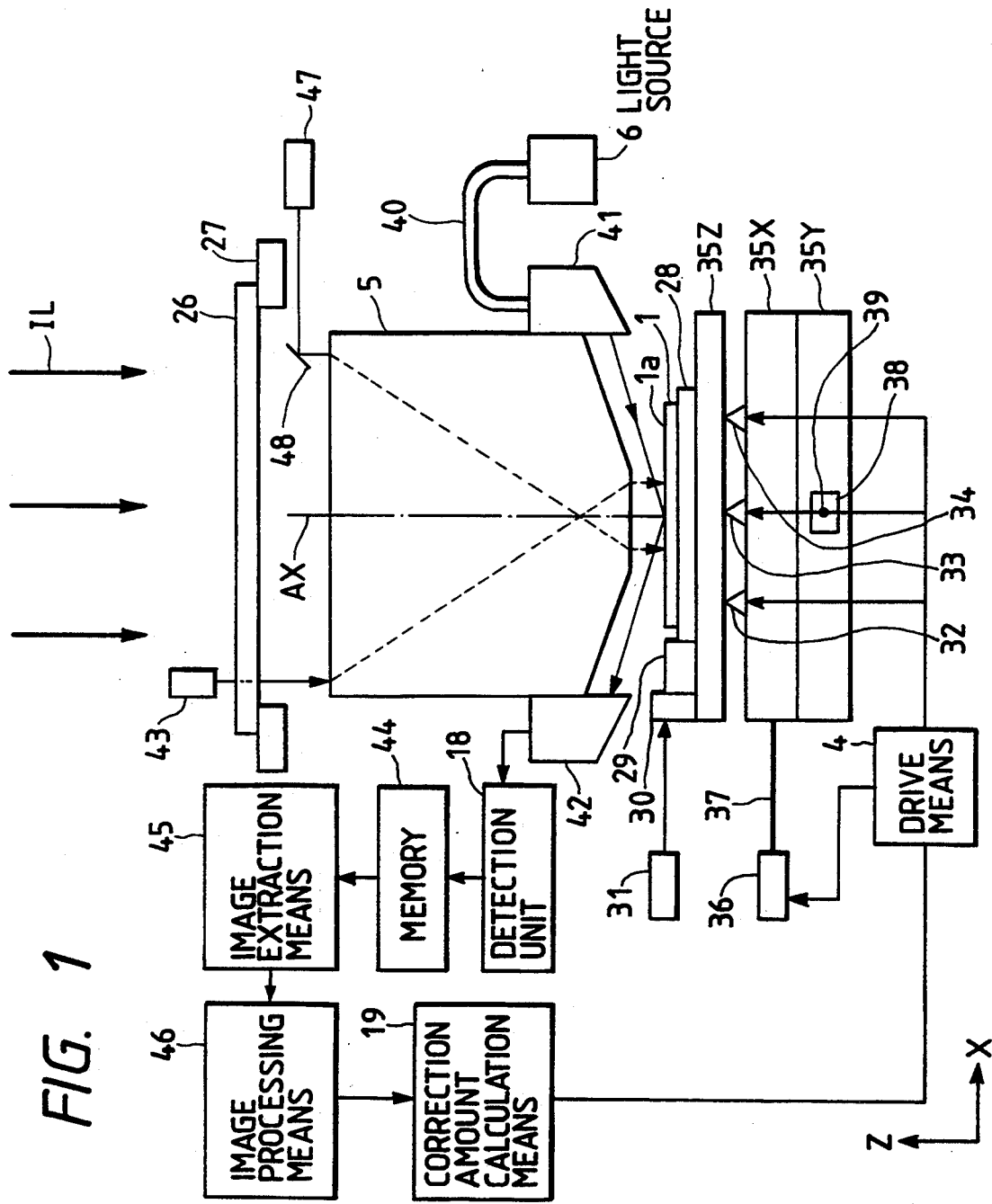
FIG. 1 is a view showing main part of a projection type exposure apparatus having a position detection apparatus according to the present invention.
Figure 5:
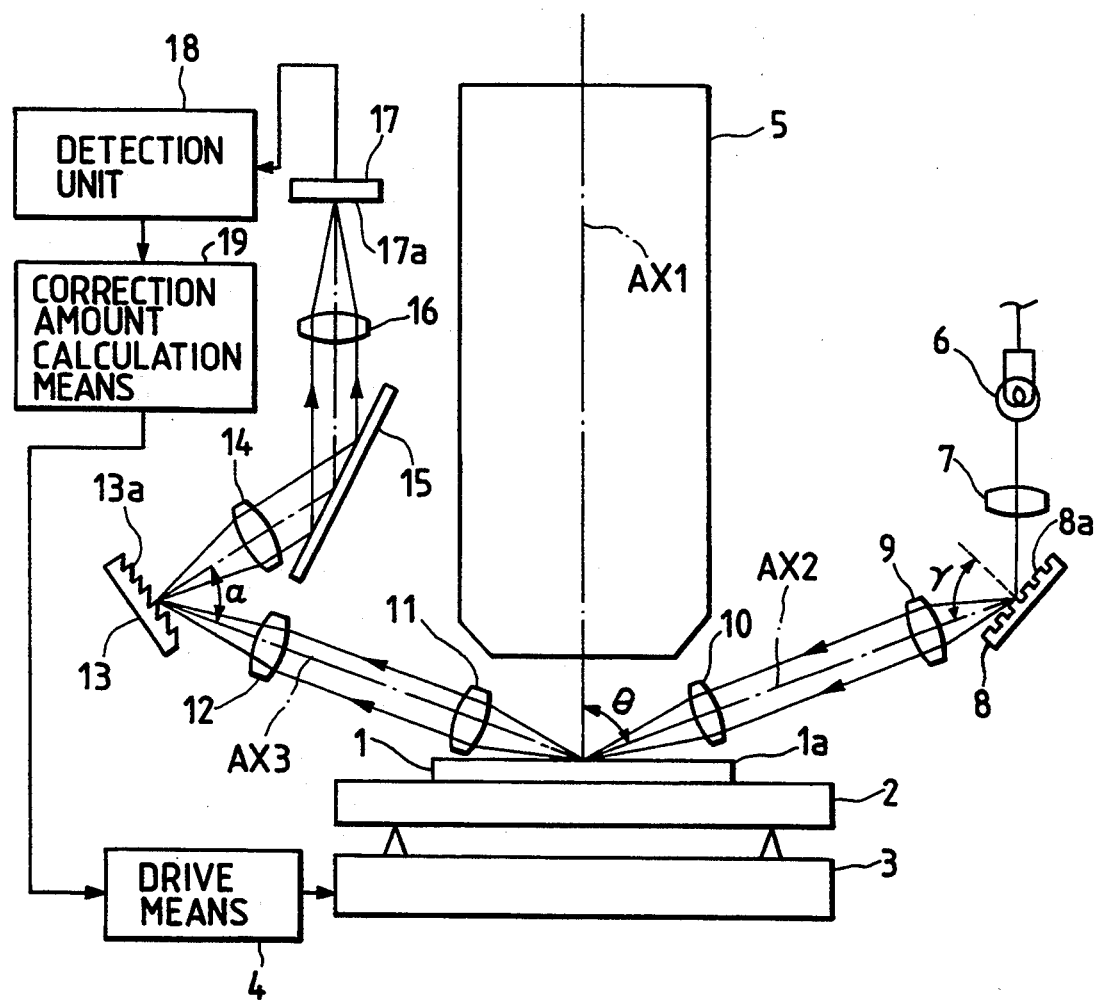
FIG. 5 is a view showing a projection type exposure apparatus having a plane level detection system disclosed in a prior patent application by the present assignee.
Figure 8:
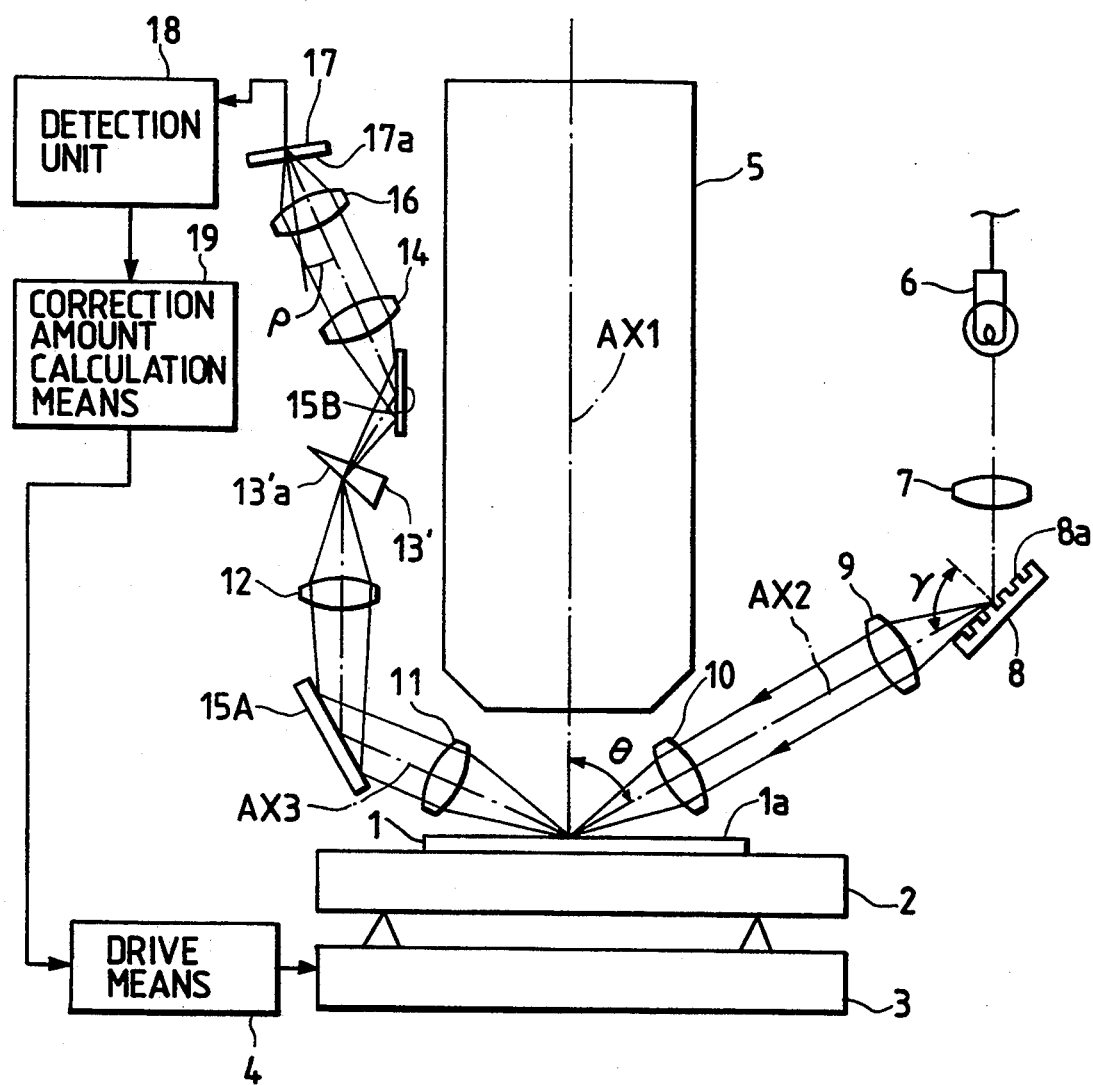
FIG. 8 is a view showing a modification of the plane level detection system shown in FIG. 5.

A position detection apparatus according to an embodiment of the present invention will be described below with reference to FIGS. 1 and 2. Referring to FIG. 1, a position detection apparatus of the present invention is applied to a projection type exposure apparatus, and an oblique projection type plane level detection system (6, 40, 41, 42) has the same arrangement as that of the system shown in FIG. 5 or 8.

Referring to FIG. 1, a circuit pattern to be transferred is drawn on a reticle 26 held by a reticle holder 27, and exposure light IL from an illumination optical system (not shown) illuminates a pattern formation area of the reticle 26 with a substantially uniform illuminance. The exposure light IL transmitted through the reticle 26 is incident on a bi-telecentric projection optical system 5, which transfers the image of the circuit pattern on a shot area on a wafer 1 in a reduction scale of 1/5.

The wafer 1 is held on a wafer holder (θ table) 28, which is mounted on a Z stage 35Z. The Z stage 35Z is mounted on an X stage 35X and a Y stage 35Y through three sets of drive mechanisms (for example, piezo elements) 32, 33, and 34. A drive motor 36 rotates a lead screw 37 to drive the X stage 35X in an X direction, which is normal to an optical axis AX (Z axis) of the projection optical system 5 and parallel to the plane of drawing of FIG. 1. A drive motor 38 rotates a lead screw 39 to drive the Y stage 35Y in a Y direction which is normal to the Z axis and normal to the plane of drawing of FIG. 1. A drive means 4 vertically and independently drives (expands and contracts) the three sets of drive mechanisms 32 to 34 arranged at the respective apexes of a regular triangle along the Z axis. Thus, the Z stage 35Z is movable and tiltable along the Z axis to perform focusing and gradient correction of the shot area on the wafer 1.

A reference mark plate 29 formed with various alignment marks is provided near the θ table 28 on the Z stage 35Z. A movable mirror 30 which reflects a laser beam from a laser interferometer 31 is mounted on the end portion of the Z stage 35Z. The position (coordinate), in the X direction, of the X stage 35X is continuously measured by the laser interferometer 31 at a resolution of, e.g., 0.1 μm. A laser interferometer for detecting a Y-direction position of the Y stage 35Y and a movable mirror are also provided, although they are not shown in FIG. 1.

An oblique projection type plane level detection system (multi-point AF system; 6, 40 to 42) is provided in FIG. 1. A light transmission system 41 comprises a condenser lens 7, a phase grating plate 8, and a projection optical system (lenses 9 and 10) shown in FIG. 5, and a light-receiving system 42 comprises a condenser optical system (lenses 11 and 12), a diffraction grating plate 13, relay lenses 14 and 16, a mirror 15, and a two-dimensional CCD 17 similarly shown in FIG. 5. In FIG. 1, illumination light from a light source 6 is guided to the light transmission system 41 through a light guide 40. Accordingly, a light-dark pattern (one-dimensional grating pattern) is projected onto the wafer 1 obliquely to the Z axis, an image of the light-dark pattern on the wafer 1 is refocused on the light-receiving surface of the two-dimensional CCD of the light-receiving system 42, and an image pickup signal from the CCD is written in a memory 44 through a detection unit 18.

An image detection means 45 reads out an image pickup signal corresponding to a position to be detected in the shot area on the wafer 1, and supplies the readout signal to an image processing means 46. As shown in FIG. 2, the image processing means 46 comprises a differentiation means 46A, and a zero-crossing point detection means 46B, and differentiates (calculates a difference in digital processing) an image pickup signal S1 from the image extraction means 45 by the differentiation means 46A to produce a signal S2. The zero-crossing point detection means 46B generates a signal S3 which is a high-level pulse at a negative-to-positive zero-crossing point of the differentiation signal S2. The signal S3 is supplied to a correction amount calculation means 19.

The correction amount calculation means 19 calculates a deviation between a pulse position of the signal S3 (corresponding to a bottom position of the image pickup signal S1) and a predetermined reference position, that is, a lateral shift amount of the light-dark pattern image on the shot area, and calculates a level at a position to be detected (at least one measurement point) in the shot area based on the lateral shift amount. In this manner, the reduction of the measurement precision of the plane level detection system (41, 42) due to the circuit pattern formed in the shot area on the wafer 1 in the process for the preceding layers is prevented. The correction amount calculation means 19 operates the drive mechanisms 32 to 34 by the drive means 4 in accordance with the calculated level to cause the entire shot area to coincide with the best focal plane of the projection optical system within the range of the focal depth.

A TTL type alignment system 47 is provided in FIG. 1. The alignment system 47 radiates alignment light (low-sensitivity light to a photoresist on the wafer 1) having a different wavelength band from that of the exposure light IL onto the wafer 1 through a mirror 48 and the projection optical system 5, and photoelectrically detects the light reflected by the alignment mask on the wafer 1 through the projection optical system 5 and the mirror 48. An alignment microscope 43 is movably arranged above the reticle 26. The detailed arrangements of the alignment system 47 and the alignment microscope 43 are disclosed in U.S. Pat. No. 4,677,301.

A reticle alignment mark and a wafer alignment mark are formed on the reference mark plate 29. The reticle mark formed on the reticle 26 is aligned to the reticle alignment mark on the reference mark plate 29 by using the alignment microscope 43 to position the reticle 26 to the reference mark plate 29 (orthogonal coordinate system XY). The illumination light from the alignment system 47 is radiated on the wafer alignment mark on the reference mark plate 29 through the projection optical system 5 to align the wafer alignment mark to the reference position of the alignment system 47, so that the alignment system 47 is positioned to the reference mark plate 29. As a result, the calibration is made between the position of the reticle 26 and the position of the alignment system 47.

Figure 3:
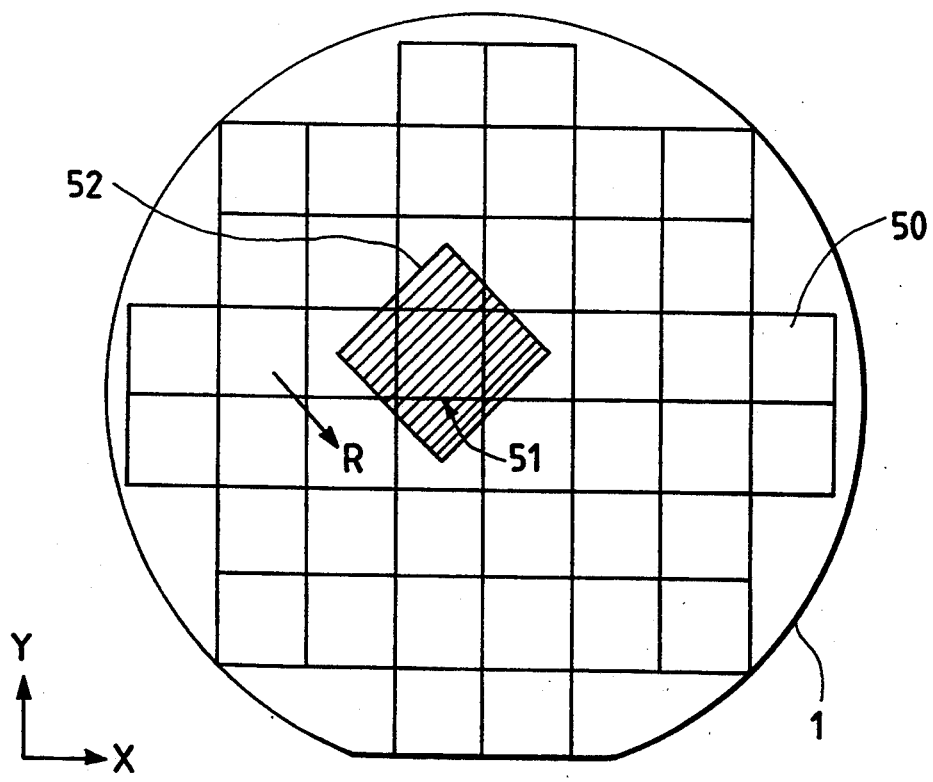
FIG. 3 is a view showing a state of a light-dark pattern projected onto a wafer.

The rotation angle of the wafer 1 (rotation angle of the wafer 1 with respect to the orthogonal coordinate system XY defined by the two sets of laser interferometers (31)) is measured by the alignment system 47, and is corrected by rotating the θ table 28. As shown in FIG. 3, a plurality of shot areas (circuit pattern areas) 50 are regularly arranged in the X and Y directions on the wafer 1. As disclosed in, e.g., U.S. Pat. No. 4,780,617, wafer marks attached to three or more shot areas on the wafer 1 are measured by the alignment system 47, and the plurality of mark positions are statistically calculated to determine the coordinates of the shot areas on the wafer 1 on the orthogonal coordinate system XY. The X and Y stages 35X and 35Y are driven in accordance with the calculated coordinates to position each shot area on the wafer 1 to the exposure position accurately.

In FIG. 1, the plane containing the optical axis of the light transmission system 41 and the optical axis of the light-receiving system 42 is inclined by 45° to the XZ plane which is parallel to the plane of drawing of FIG. 1, and the YZ plane which is normal to the plane of drawing of FIG. 1. The direction of arrangement of the light-dark pattern (the direction of pitch of the fringe) projected onto the wafer 1 is parallel to the plane containing the optical axis of the light transmission system 41 of FIG. 1 and the optical axis of the light-receiving system 42. As shown in FIG. 3, the direction of pitch (R direction) of the light-dark pattern projected onto the shot area 50 is inclined by 45° to the X and Y directions, so that it crosses the X and Y directions, because the circuit pattern formed in the shot area 50 includes many linear patterns extending in the X and Y directions. While exaggeratedly shown in FIG. 3, a projection area 52 of the light-dark pattern on the wafer 1 is designed to be larger than the shot area 50, so that it completely covers one shot area 50. Note that the projection area 52 of the light-dark pattern may be smaller than the shot area 50. In essence, it is necessary that the light-dark pattern is projected to a partial area which includes at least one measurement point in the shot area, and any shape or size may be selected.

Figure 4A:
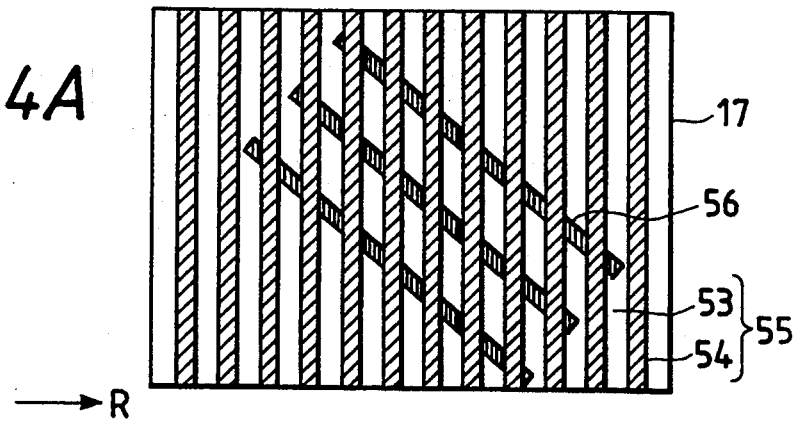
FIG. 4A is a view showing a pattern image focused on the light-receiving surface of a two-dimensional CCD shown in FIG. 1 in the first embodiment.
Figure 4B:
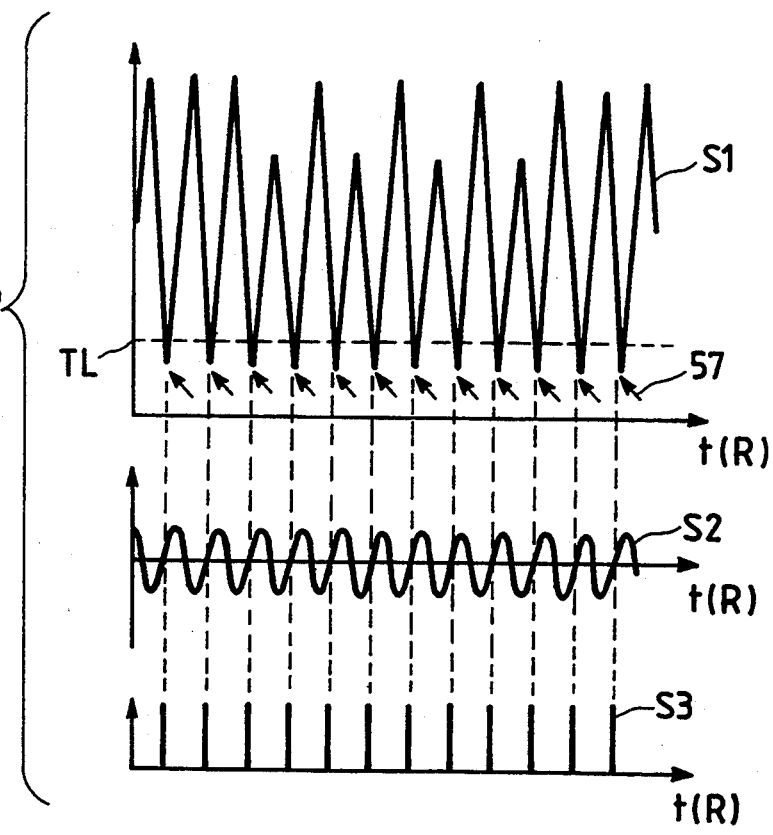
FIG. 4B is a chart for explaining a method of processing an image pickup signal from the CCD.

A position detection operation according to the first embodiment of the present invention will be described below with reference to FIGS. 3, 4A, and 4B. A circuit pattern extending in the Y direction is formed on each shot area on the wafer 1, and the light-dark pattern is projected onto a shot area 51 on the wafer 1, as shown in FIG. 3. As shown in FIG. 4A, an image 55 of the light-dark pattern, in which a light portion 53 and a dark portion 54 repetitively appear alternately at a predetermined pitch, and an image 56 of the circuit pattern are focused to overlap each other on the light-receiving surface of the two-dimensional CCD 17. An image pickup signal on a scan line which crosses the image 56 of the circuit pattern in FIG. 4A, that is, a scan line along the R direction, is extracted by the image extraction means 45 (FIG. 1), thus obtaining an image pickup signal S1 shown in FIG. 4B. The image pickup signal S1 has various peaks corresponding to the light portions 53. Namely, the peak of the light portion 53 in which the image 56 of the circuit pattern is present is lower than other peaks. In FIG. 4B, the abscissa represents a time t which corresponds to the coordinate in the R direction in FIG. 3. In this embodiment, the bottom position of the waveform corresponding to the dark portion 54 indicated by an arrow 57 in the waveform of the image pickup signal S1 is specified (detected).

The image pickup signal S1 is differentiated by the differentiation means 46A (FIG. 2) to obtain a signal S2 shown in FIGS. 4A and 4B. A negative-to-positive zero-crossing point of the signal S2 is extracted by the zero-crossing point detection means 46B (FIG. 2), thereby obtaining the signal S3 shown in FIG. 4B. The signal S3 has a high level pulse at the bottom position of the image pickup signal S1. The signal S3 is supplied to the correction amount calculation means 19 (FIG. 1), which detects a difference (positional shift amount) between the high level pulse position of the signal S3 and the reference position to determine the position of each point on the scan line along the optical axis of the projection optical system 5.

In this embodiment, the waveform representing the dark portion 54 in the pattern image focused on the light-receiving surface of the two-dimensional CCD 17 is used. In this case, the signal level (voltage) at the dark portion 54 is not lowered even if the circuit pattern is formed on the shot area on the wafer 1. Namely, the signal level is substantially constant regardless of the presence/absence of the image of the circuit pattern. As a result, the bottom position of the waveform corresponding to the dark portion 54 can always be detected exactly. A bottom of a noise dark portion may be formed depending on an image of the circuit pattern, but can be eliminated by averaging the bottoms of dark portions using a plurality of scan lines in a predetermined area. The position of an arbitrary point in the projection area 52 of the light-dark pattern, that is, the shot area 50 along the optical axis of the projection optical system 5 can be detected by shifting the scan line which extends along the R direction in FIG. 4A in a direction normal to the R direction.

Figure 2:
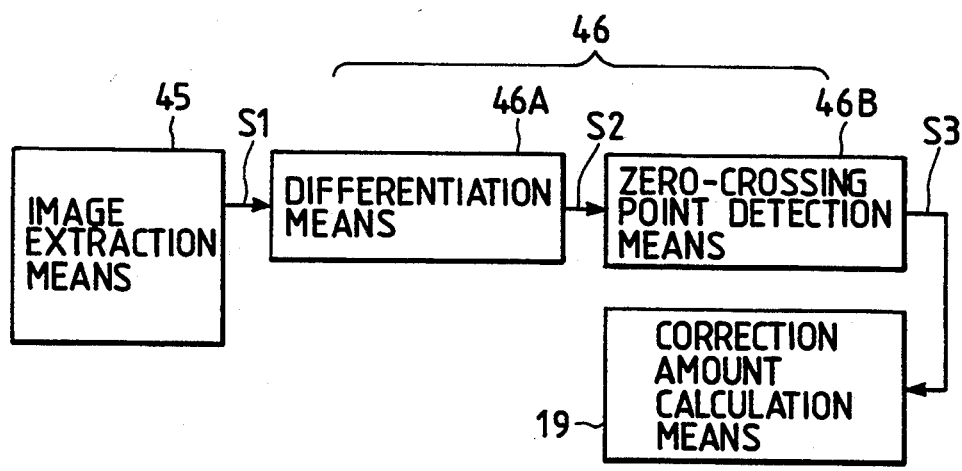
FIG. 2 is a diagram showing a detailed arrangement of image processing means shown in FIG. 1.

In FIG. 2, the bottom position of the image pickup signal S1 corresponding to the dark portion 54 is detected by the differentiation means 46A. Alternatively, a portion in which the signal level of the image pickup signal S1 is lower than a predetermined threshold TL may be extracted, as shown in FIG. 4B. In this case, the threshold TL may be set to be higher by a predetermined value than a minimum level (corresponding to the illuminance of the dark portion) of the image pickup signal S1.

In order to eliminate the influence of the image 56 of the circuit pattern, it is desirable to project a light-dark pattern which has a high contrast ratio and as low dark area illuminance as possible onto the wafer 1. In order to increase the contrast ratio and decrease the illuminance of the dark portion, 0th-order light from the phase grating plate 8 is to be extinguished in FIG. 5 or 8, and a fringe pattern is to be projected onto the wafer 1 using only ±1st-order diffracted light components from the phase grating plate 8. Alternatively, an amplitude type or phase type grating plate, with which the intensity of 0th-order light substantially coincides with that of 1st-order diffracted light, may be used in place of the phase grating plate 8, and a fringe pattern may be projected onto the wafer 1 using 0th-order light and +1st-order diffracted light (or 0th-order light and −1st-order diffracted light). When the light-dark patterns of the same pitch are projected onto the wafer 1 by projecting only ±1st-order diffracted light components, the 0th-order light and the +1st-order diffracted light, or the 0th-order light and the −1st-order diffracted light onto the wafer 1, the numeric aperture (NA) of the objective lens may be one half of that required when the 0th-order light and the ±1st-order light components are used in combination, and the size reduction of the optical system is attained.

The second embodiment of the present invention will be described below. In this case, since a position detection apparatus of this embodiment has the same arrangement as that of the first embodiment (FIG. 1), a detailed description thereof will be omitted.

In this embodiment, in order to eliminate the influence of a circuit pattern formed in a shot area on the wafer, at least one of the X stage 35X and the Y stage 35Y is operated to move (e.g., vibrate) the wafer (shot area) in an XY plane perpendicular to the Z axis upon detection of the level (the position in the Z axis direction) of the shot area. More specifically, the X stage 35X and the Y stage 35Y are driven to vibrate the wafer 1 in an R direction (the direction of pitch of a light-dark pattern) crossing the X and Y axes at 45°. At this time, it is preferable to vibrate the wafer 1 while the two-dimensional CCD 17 fetches the image of a light-dark pattern 52. For example, if the length, in the R direction, of the shot area is represented by L1, and the distribution of positions in the Z direction is detected in a unit ΔL of length in the direction of the length L1, the amplitude of the vibration in the R direction is preferably set to be ΔL or less. In other words, the amplitude of the wafer 1 is preferably set to be equal to or smaller than about a minimum value of the lateral shift amount of a pattern image to be detected on an image pickup surface. If the magnification of the light-receiving system coupling the wafer surface and the focal plane of the two-dimensional CCD is other than an equal magnification (×1), the amplitude of the wafer 1 must be determined from the above-mentioned minimum value in consideration of this magnification. Note that the minimum value of the lateral shift amount is a value corresponding to the detection resolution of the plane level detection system. In this embodiment, the wafer is preferably vibrated in a direction crossing the longitudinal direction of the light portion (or dark portion) of the light-dark pattern. Furthermore, when a circuit pattern is formed on the wafer 1 to extend in a direction parallel to the R direction, the wafer is preferably vibrated in a direction crossing the R direction. In this embodiment, the influence of the circuit pattern on position detection in the plane level detection system can be eliminated by vibrating the wafer, as described above. Note that the wafer 1 may be moved in the R direction (at a low speed) in place of vibrating the wafer 1.

Figure 9A:
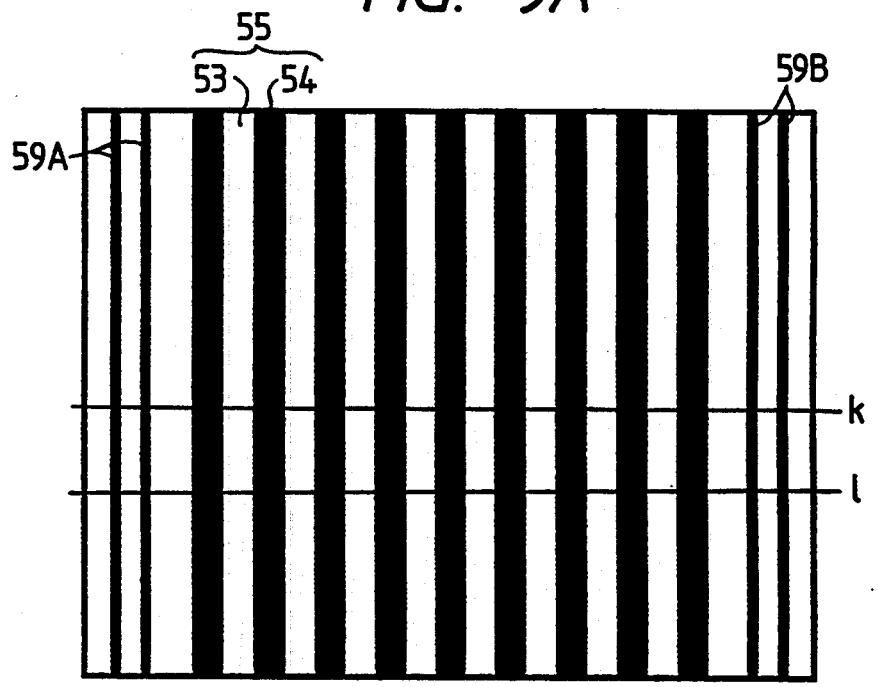
FIG. 9A is a view showing an image of a light-dark pattern focused on the image pickup plane in a light-receiving system shown in FIG. 1 in the second embodiment.

The light-dark pattern projected onto the wafer 1 is refocused on the image pickup surface of the two-dimensional CCD in the light-receiving system 42 (FIG. 1). FIG. 9A shows a pattern image focused on the image pickup surface (corresponding to the image pickup surface 17a in FIG. 5) of the light-receiving system 42. A pattern image (light-dark fringe) 55 consisting of light and dark portions 53 and 54 is refocused on the image pickup surface shown in FIG. 9A, and index mark images 59A and 59B serving as a reference upon detection of a fringe position are also focused on the two end portions of the image pickup surface. Original patterns of these index mark images 59A and 59B are formed on an incident surface 13'a of a dump correction prism 13', and are fixed on the image pickup surface.

Figure 9B:
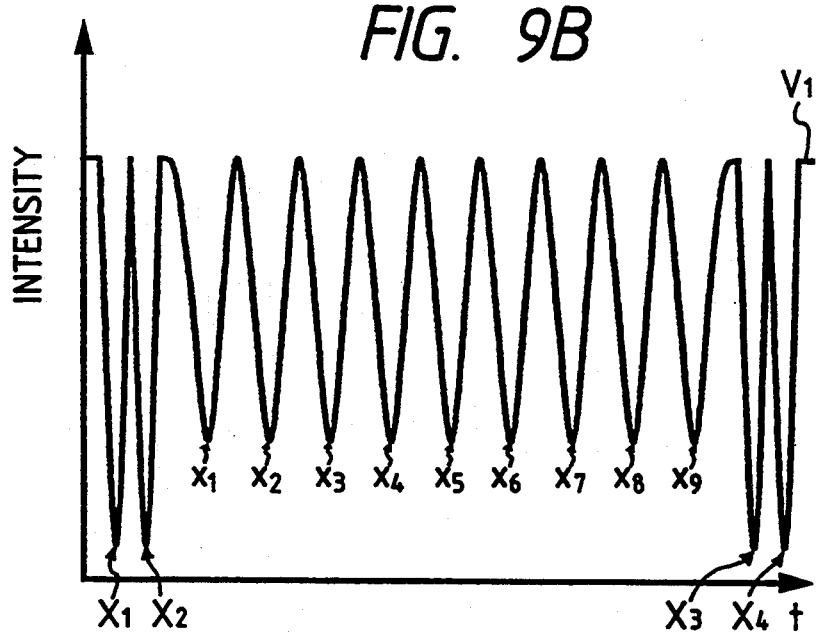
FIG. 9B is a chart showing an image pickup signal along a scan line shown in FIG. 9A.

The image on the image pickup surface in FIG. 9A is picked up by the two-dimensional CCD in the light-receiving system 42, and an image pickup signal from the two-dimensional CCD is stored in the memory 44 via the detection unit 18 (FIG. 1). The image extraction means 45 selects image pickup signals $V_1$ from the kth scan line to the lth scan line in FIG. 9A. FIG. 9B shows an image pickup signal obtained by averaging these image pickup signals $V_1$. In FIG. 9B, the abscissa represents a time base t. The time base t can also be regarded as a coordinate (to be referred to as an X coordinate hereinafter) in the scan direction of FIG. 9A.

As can be seen from the averaged image signal $V_1$ (FIG. 9B), the image pickup signal has upper peaks and lower peaks (bottoms) in correspondence with the light and dark portions 53 and 54 of the pattern image on the image pickup surface. In this embodiment, the centers of the dark portions 54 of the pattern image on the image pickup surface, i.e., the bottom points of the image pickup signal $V_1$, are detected as in the first embodiment. As shown in FIG. 9B, coordinates $x_1$ to $x_9$ of bottom points corresponding to the centers of the dark portions 54 of the pattern image 55 in FIG. 9A, and coordinates $X_1$ to $X_4$ of bottom points corresponding to the index mark images 59A and 59B, are obtained. These coordinates $x_1$ to $x_9$ and $X_1$ to $X_4$ are detected by differentiating the image pickup signal to obtain zero-crossing points in the image processing means 46 (FIG. 1).

Then, the coordinates $x_1$ to $x_9$ of the bottom points corresponding to the centers of the dark portions 54 of the pattern image 55 are normalized with reference to the coordinates $X_1$ to $X_4$ of the index mark images, thus obtaining coordinates $s_1$ to $s_9$. This is to obtain a coordinate $s_j (j=1, 2, \ldots, 9)$ of the center of each dark portion 54 of the pattern image 55 when a middle point between the index mark images 59A and 59B on the image pickup surface is defined as an origin. The coordinate $s_j$ is given by the following equation:

$$s_j = x_j - (X_1 + X_2 + X_3 + X_4)/4 \qquad (2)$$

A total of n scan lines in FIG. 9A are divided into m groups, the coordinates of the centers of the dark portions 54 are calculated in units of divided groups, and the coordinates are normalized using equation (2), thereby determining the positions of the dark portions 54 of the image 55 with reference to the index mark images 59A and 59B on the entire image pickup surface. The relationship among these parameters m and n, and the numbers k and l of scan lines in FIG. 9A is given by:

$$l - k + 1 = n/m \qquad (3)$$

With the above-mentioned operation, coordinates $s_{ij}$ ($i=1, 2, \ldots, m; j=1, 2, \ldots, 9$) of (m×9) dark portions 54 of the pattern image 55 are determined, and are supplied to the correction amount calculation means 19 (FIG. 1). The correction amount calculation means 19 pre-stores target positions $W_{ij}$ of the dark portions 54, and substitutes a difference $\Delta s_{ij} = (s_{ij} - W_{ij})$ from each target position in the lateral shift amount y in equation (1), thus obtaining a position z. In this manner, a displacement amount $\Delta z_{ij}$ from the reference position (the Z coordinate of the best focal plane of the projection optical system 5 in FIG. 1) in the Z direction of a wafer surface 1a is obtained in units of (m×9) blocks.

From the (m×9) displacement amounts $\Delta z_{ij}$, three or more and (m×9) or less displacement amounts, which are not aligned on a straight line, are selected, and the level and the inclination amount of the surface of each shot area on the wafer 1 are calculated on the basis of the selected displacement amounts. At this time, even if each shot area has a step structure (three-dimensional pattern), an average plane (approximate plane) of each shot area is calculated by, e.g., a least square method, and the level and the inclination amount of the average plane can be calculated. Thereafter, the correction amount calculation means 19 calculates correction amounts for driving the drive mechanisms 32 to 34, and supplies the calculated correction amounts to the drive means 4. The drive means 4 moves the drive mechanisms 32 to 34 (and the Z stage 35Z as needed) by the supplied correction amounts, thus attaining auto-focusing and leveling of each shot area. After the vibration of the X stage 35X and the Y stage 35Y is stopped, the pattern on the reticle 26 is exposed on the shot area.

Figure 10A:
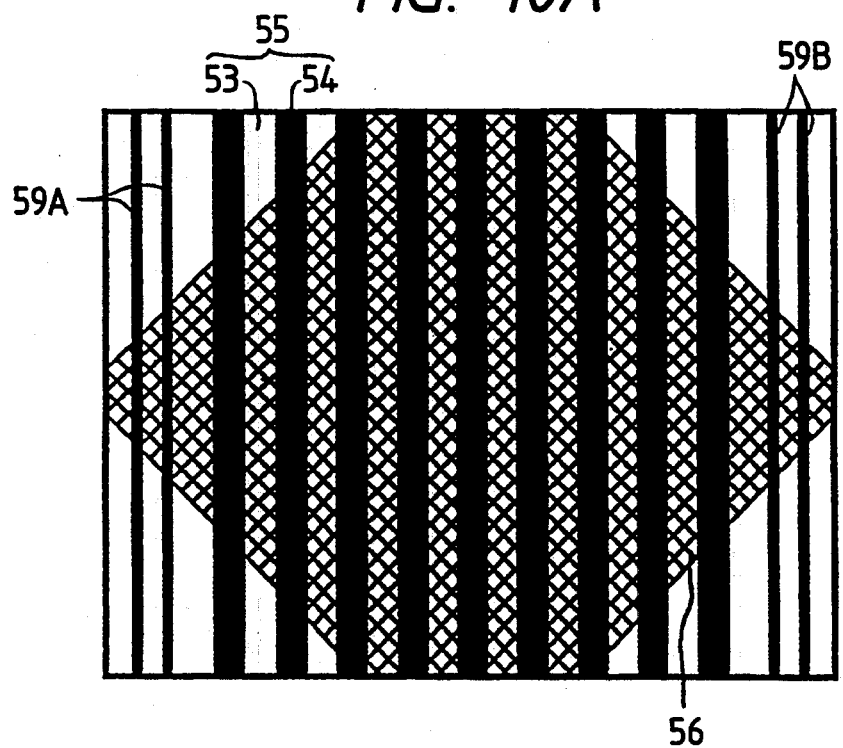
FIG. 10A is a view showing images of a circuit pattern and a light-dark pattern focused on the image pickup plane in the light-receiving system in FIG. 1 in the second and third embodiments.

In this embodiment, when the pattern image (FIG. 9A) is picked up by the two-dimensional CCD in the light-receiving system 42 in FIG. 1, a circuit pattern may have already been formed in each shot area. FIG. 10A shows a pattern image on the image pickup surface corresponding to FIG. 9A obtained when the circuit pattern is formed in the shot area. Referring to FIG. 10A, an image 56 of the circuit pattern is focused to overlap the light-dark pattern 55. However, as described above, the wafer 1 is vibrated in the R direction in FIG. 3, i.e., in the direction crossing the circuit pattern in the image pickup operation. For this reason, images are averaged within an accumulation time of each image pickup element of the two-dimensional CCD (two-dimensional charge coupled image pickup device), and the edge of the image 56 of the circuit pattern is blurred. Therefore, the lateral shift amount of each portion of the light-dark fringe 55 can be precisely detected without being influenced by the image 56 of the circuit pattern, and the surface (or an average plane) of each shot area can be precisely determined.

The third embodiment of the present invention will be described below. This embodiment also uses the apparatus shown in FIG. 1. In this embodiment as well, when a pattern image is picked up by the two-dimensional CCD in the light-receiving system, a wafer is moved in a predetermined direction. In particular, in this embodiment, in a process for moving a wafer to expose the next shot area after exposure on one shot area on a wafer is completed, the above-mentioned image pickup operation is performed before the next shot area reaches the exposure position.

Figure 10B:
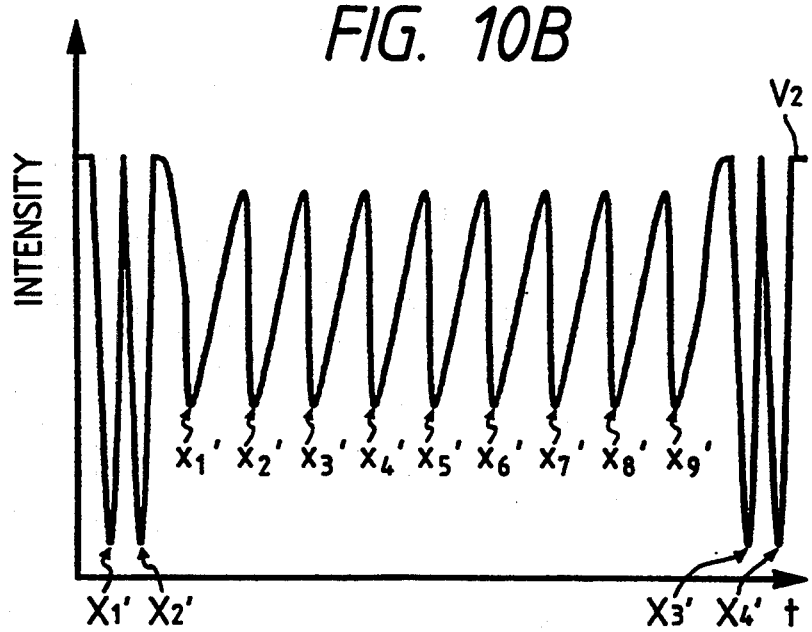
FIG. 10B is a chart showing an image pickup signal along a scan line shown in FIG. 10A.

FIG. 10A shows a pattern image picked up by the two-dimensional CCD. In this embodiment, since the wafer 1 is also moved during the image pickup operation, the edge of an image 56 of a circuit pattern is blurred. FIG. 10B shows an image pickup signal $V_2$ along a predetermined scan line in FIG. 10A. Referring to FIG. 10B, coordinates $x_1'$ to $x_9'$ of the dark portions 54 of the pattern image (light-dark fringe) 55, and coordinates $X_1'$ to $X_4'$ of the index mark images 59A and 59B are detected as in the second embodiment (FIG. 9B), and normalized coordinates $s_j'$ (j=1, 2, ..., 9) of the dark portions 54 are calculated by the following equation. In this case, these coordinates $s_j'$ are calculated in units of groups obtained by dividing scan lines in FIG. 10A into m groups. This process will be referred to as the first step hereinafter.

$$s_j' = X_j' - (X_1' + X_2' + X_3' + X_4')/4 \quad (4)$$

After the shot area on the wafer 1 reaches the exposure position, and the X stage 35X and the Y stage 35Y are almost stopped, operations from an image pickup operation of the pattern image in FIG. 10A to a calculation of coordinates $s_{ij}''$ (i=1, ..., m) obtained by normalizing the coordinates of the bottom points of the dark portions 54 in FIG. 10B are executed again. This process will be referred to as the second step hereinafter.

Figure 11A:
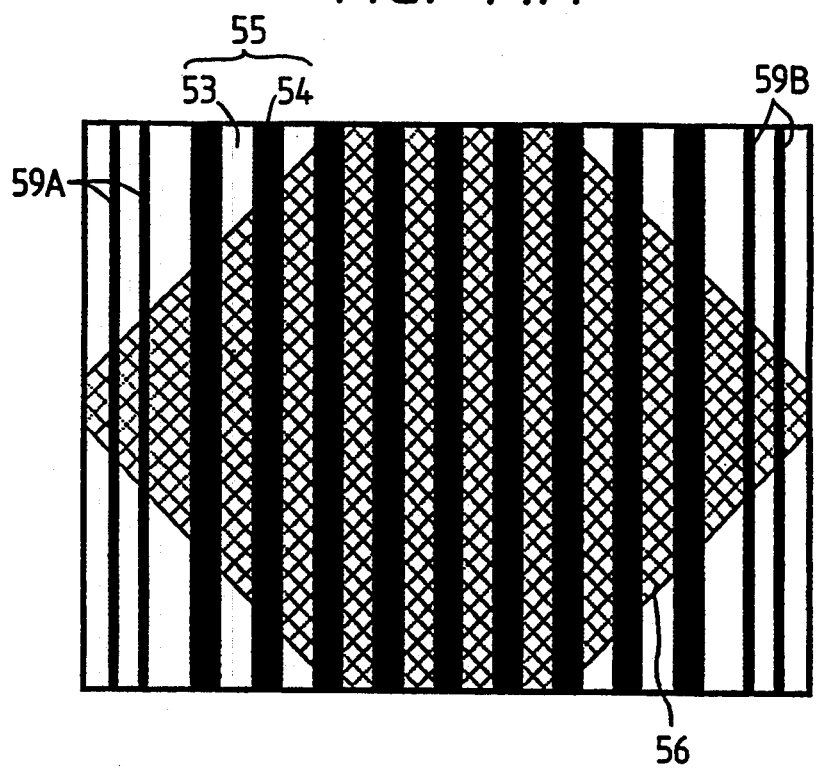
FIG. 11A is a view showing images of a circuit pattern and a light-dark pattern focused on the image pickup plane in the light-receiving system in FIG. 1 in the third embodiment.
Figure 11B:
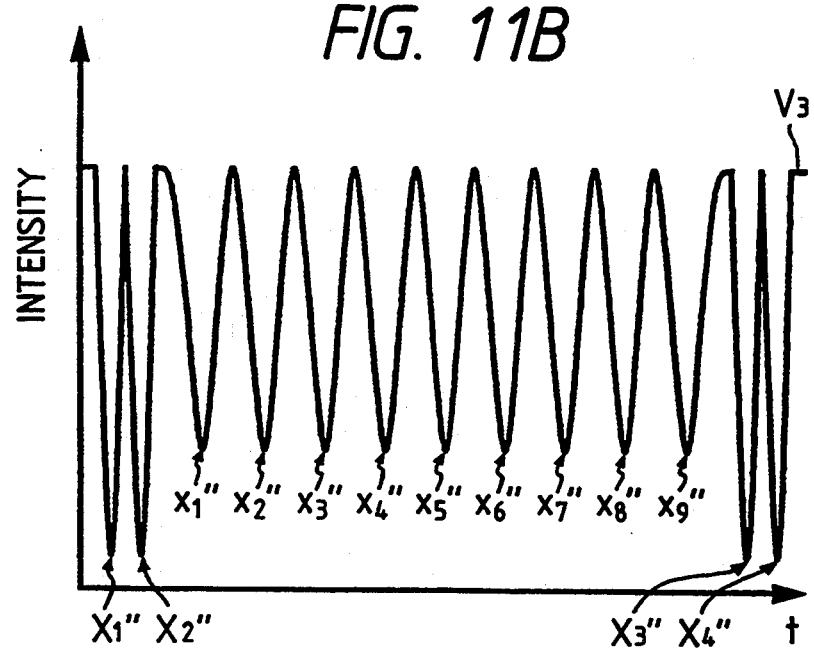
FIG. 11B is a chart showing an image pickup signal along a scan line shown in FIG. 11A.

In the second step, as shown in FIG. 11A, the edge of the image 56 of the circuit pattern is not blurred, and is clearly observed. FIG. 11B shows an image pickup signal $V_3$ along a predetermined scan line in FIG. 11A. Referring to FIG. 11B, the image pickup signal $V_3$ is distorted due to the influence of the image 56 of the circuit pattern. Therefore, although the wafer 1 is not displaced in the Z axis direction during an interval between the first and second steps, coordinates $x_{ij}''$ (i=1, ..., m; j=1, ..., 9) of the dark portions of the light-dark fringe 55 are different from those detected while moving the wafer 1 in the first step, and the coordinates $s_{ij}''$ calculated by normalizing these coordinates are also different from the coordinates $s_{ij}'$ calculated in the first step. In this embodiment, a difference $\epsilon_{ij}(=s_{ij}''-s_{ij}')$ is calculated, and is subtracted from each coordinate $s_{ij}''$ calculated in the second step, thereby determining a corrected coordinate $s_{ij}^*(=s_{ij}''-\epsilon_{ij})$. When the corrected coordinates $s_{ij}^*$ are used in place of the coordinates $s_{ij}$ in the second embodiment (FIG. 9B), the subsequent operations are performed in the same manner as in FIG. 9B.

Even when the drive mechanisms 32 to 34 are moved in accordance with the correction amounts determined by the correction amount calculation means 19 (FIG. 1), the exposure surface of the wafer 1 does not always reach the target position due to a drive error or the like. In order to prevent this, after the drive mechanisms 32 to 34 are operated, the second step (operations from the image pickup operation to the calculation of the coordinates $s_{ij}''$ of the dark portions) is re-executed, and the corrected coordinates $s_{ij}^*$ are calculated from the previously calculated differences $\epsilon_{ij}$. Furthermore, the level and inclination of the exposure surface 1a are calculated based on the corrected coordinates $s_{ij}^*$, and when a residual error is still as large as it cannot be ignored, correction amounts are determined again, and are supplied to the drive means 4. It is preferable that the above-mentioned operation is repeated, and exposure is performed when the position shift amount of the exposure surface 1a with respect to the best focal plane of the projection optical system 5 becomes equal to smaller than a predetermined allowable value, in other words, when the exposure surface is set within the range of the focal depth of the projection optical system 5.

According to the third embodiment described above, when the drive mechanisms 32 to 34 are operated, the X stage 35X and the Y stage 35Y are already stopped, and exposure can be started simultaneously with the end of auto-focusing and leveling of the exposure surface 1a. Therefore, the throughput of the exposure process can be improved.

The fourth embodiment of the present invention will be described below. In this embodiment, differences $\epsilon_{ij}$ calculated in the first shot area on the wafer are also used for the second and subsequent shot areas. More specifically, in this embodiment, the first and second steps are executed on the first shot area on the wafer to calculate differences $\epsilon_{ij}$, and only the second step is executed on the second and subsequent shot areas. More specifically, the coordinates $s_{ij}''$ of the shot area are calculated while the wafer stands still. The differences $\epsilon_{ij}$ are subtracted from the calculated coordinates $s_{ij}''$, thereby obtaining the precise coordinates in the Z axis direction, i.e., the corrected coordinates $s_{ij}^*$ on the second and subsequent shot areas. For this reason, the operations in the first step, i.e., the detection of the lateral shift amount of the light-dark fringe while moving the wafer 1, need not be executed on the second and subsequent shot areas. Thus, the throughput of the exposure process can be improved. Note that the first and second steps may be executed on each of a plurality of shot areas on the wafer to calculate differences $\epsilon_{ij}$, the plurality of sets of differences $\epsilon_{ij}$ may be, for example, averaged, and the average values may be used for the subsequent shot areas.

The fifth embodiment of the present invention will be described below. Since a position detection apparatus of this embodiment has basically the same arrangement as that of the first embodiment (FIG. 1), a detailed description thereof will be omitted. In this embodiment, however, only the arrangement of a light-dark pattern to be projected onto a wafer is different from the above embodiments. The arrangement of a light-dark pattern to be used in this embodiment will be described below with reference to FIG. 12.

Figure 12:
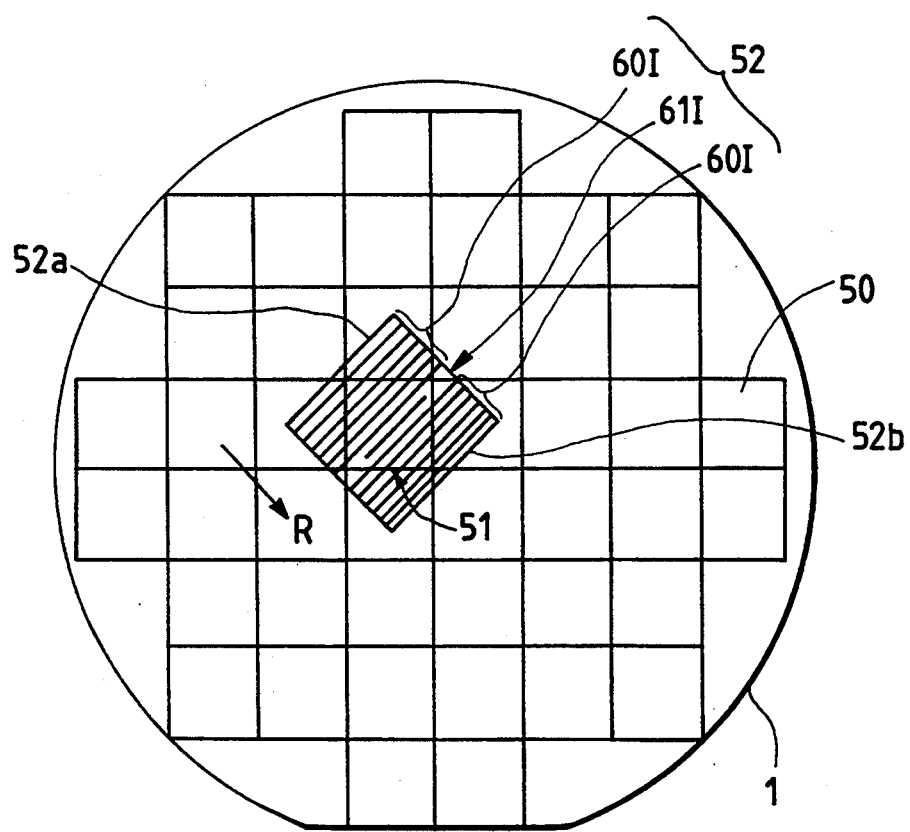
FIG. 12 is a view showing a light-dark pattern projected onto a wafer in the fifth embodiment.

As shown in FIG. 12, a pattern transfer area 50 consisting of a large number of shot areas 51 is formed on the surface of the wafer 1, and a periodic light-dark pattern 52 including a non-repetitive portion is projected onto a shot area 51 to be exposed. The light-dark pattern 52 is constituted by grating patterns 60I arranged at a predetermined pitch in an R direction crossing each side of the shot area 51 at 45°, and a short straight line pattern 61I arranged at the central portion of the grating patterns 60I. The short straight line pattern 61I corresponds to the non-repetitive portion. Note that an edge portion 52a or the like at the end of the grating patterns 61I may be regarded as the non-repetitive portion, as will be described later. When the direction of pitch (R direction) of the grating pattern 60I is set obliquely to each side of the shot area 51, the influence of a circuit pattern already formed in the shot area 51 can be eliminated.

Figure 13A:
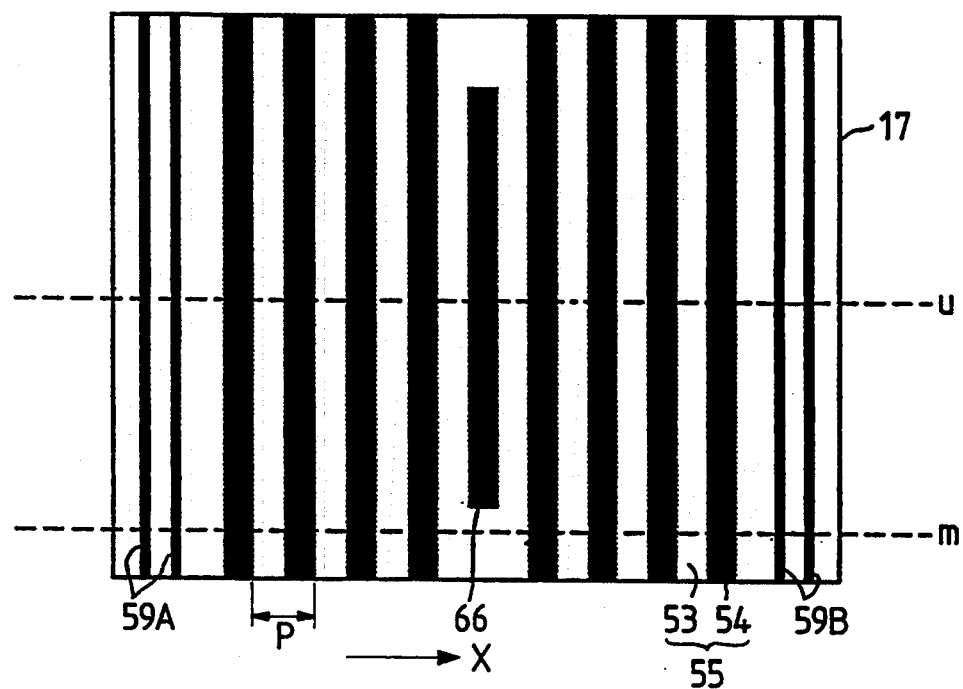
FIG. 13A is a view showing an image of a light-dark pattern focused on the image pickup plane in the light-receiving system in FIG. 1 in the fifth embodiment.

FIG. 13A shows an image of the light-dark pattern in FIG. 12 refocused on the image pickup surface of the two-dimensional CCD 17. Referring to FIG. 13A, light and dark portions 53 and 54, i.e., grating pattern images 55, are focused at a pitch P in the X direction parallel to one side of the image pickup surface, and a shot straight line pattern image 66 is focused at the central portion of the grating pattern images 55. The grating pattern images 55 and the straight line pattern image 66 are respectively conjugate images of the grating patterns 60I and the straight line pattern 61I in FIG. 12. As in the second embodiment (FIG. 9A), an index mark image consisting of two thin straight line pattern images is focused on one end portion, in the X direction, of the image pickup surface, and an index mark image 59B consisting of two thin straight line pattern images is focused on the other end portion in the X direction. The index mark images 59A and 59B are those of patterns formed on the incident surface 13'a of the dump correction prism 13' (FIG. 8), and are always focused at fixed positions with respect to the image pickup surface. The index marks formed on the prism 13' are illuminated with light reflected by the wafer. A beam splitter may be inserted in the light-receiving system 42 (from the lens 11 to the prism 13' in FIG. 8), and an illumination system for radiating illumination light on only the index mark portions via the beam splitter may be arranged. At this time, either illumination light from another light source or light obtained by splitting some light components of illumination light from the light source 6 in FIG. 8 may be used.

Figure 13B:
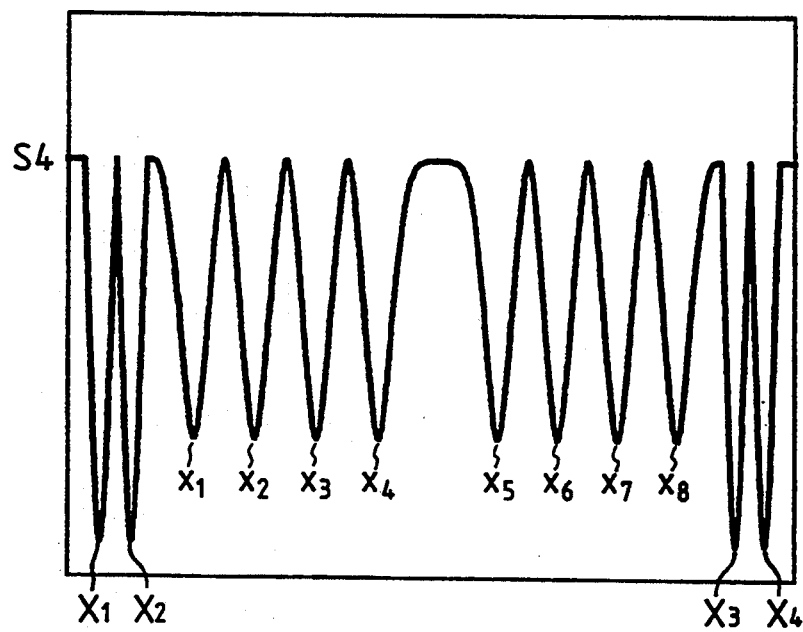
FIG. 13B is a chart showing an image pickup signal along a scan line m in FIG. 13A.

FIG. 13B shows an image pickup signal along a scan line m outside the straight pattern image 66 in FIG. 13A, i.e., a scan line which does not cross the image 66, and this image pickup signal is supplied to the image processing means 46 via the detection unit 18, the memory 44, and the image extraction means 45 (FIG. 1). The image processing means 46, i.e., the zero-crossing point detection means 46B detects the positions, in the X direction, of lower peaks (bottoms) of the image pickup signal in FIG. 13B as in the first embodiment. Of a large number of bottom positions, positions $X_1$ and $X_2$ can be regarded as the positions of two dark lines (pattern images) of the index mark image 59A, positions $X_3$ and $X_4$ can be regarded as the positions of two dark lines of the index mark image 59B, and positions $x_1$ to $x_8$ can be regarded as the positions of the grating pattern images 55. These positions $X_1$ to $X_4$ and $x_1$ to $x_8$ are supplied to the correction amount calculation means 19 (FIG. 1).

The correction amount calculation means 19 calculates a reference position $X_0$ based on the positions $X_1$ to $X_4$ of the index mark images using the following equation:

$$X_0=(X_1+X_2+X_3+X_4)/4 \qquad (5)$$

The positions $x_1$ to $x_8$ of fringes of the grating pattern images are then determined with respect to the reference position $X_0$. More specifically, if we let $q_1$ to $q_8$ be the positions of fringes of the grating pattern images from the reference position $X_0$, the following equation is established:

$$q_i=x_i-X_0(i=1, 2, \ldots, 8) \qquad (6)$$

When the positions $q_1$ to $q_8$ calculated by equation (6) are compared with the reference position (already calculated) obtained when the surface of the shot area 51 coincides with the best focal plane of the projection optical system 5, lateral shift amounts $\delta x_i$, in the X direction of the fringes of the grating pattern images are calculated. If the magnification of the lateral shift amount $\delta x$, in the X direction, of the grating pattern image to the position z, in the Z direction, of the wafer 1 is $\Omega(=\delta x/z)$, a position $z_i$, in the Z direction, of a measurement point on the shot area 51 corresponding to the position $x_i$ of each fringe of the grating pattern image is given by $\Delta x_i/\Omega$ within a range wherein the lateral shift amount $\Delta x$ of the grating pattern images as a whole does not exceed $\pm P/2$ (range P). This calculation is executed by the correction amount calculation means 19 (FIG. 1).

In this embodiment, as shown in FIG. 13A, the single straight line pattern image 66 at the center of light-dark fringe images is formed to be shorter than the grating pattern images 55. Therefore, no straight line pattern image 66 is present on the scan line m, and the central portion of the image pickup signal along the scan line m does not include any bottom corresponding to a dark portion, as shown in FIG. 13B. In this case, as can be seen from FIG. 13B, if an interval $d_{ij}$ between positions $q_i$ and $q_j$ is defined by the following equation, an interval $d_{45}$ is twice those of other intervals $d_{ij}$:

$$d_{ij}=q_j-q_i(i=1, 2, \ldots, 7; j=i+1) \qquad (7)$$

Therefore, the center of two fringe positions (positions $q_4$ and $q_5$), which have an interval twice the normal interval therebetween, can be regarded as a position $x'$ of the straight line pattern image 66. Then, in a state wherein the surface of the wafer 1 coincides with the best focal plane of the projection optical system 5, the index mark positions, for example, are adjusted, so that the straight pattern image 66 in FIG. 13A is located at the center between the index marks images 59A and 59B. The central position is defined as an origin ($x'=0$) of the position $x'$. In the case of FIG. 13A, since position $x'$ of the straight line pattern image 66 is almost 0, the level z of each measurement point on the shot area 51 calculated from the lateral shift amount $\delta x$ of the grating pattern images 55 is precise.

Figure 14A:
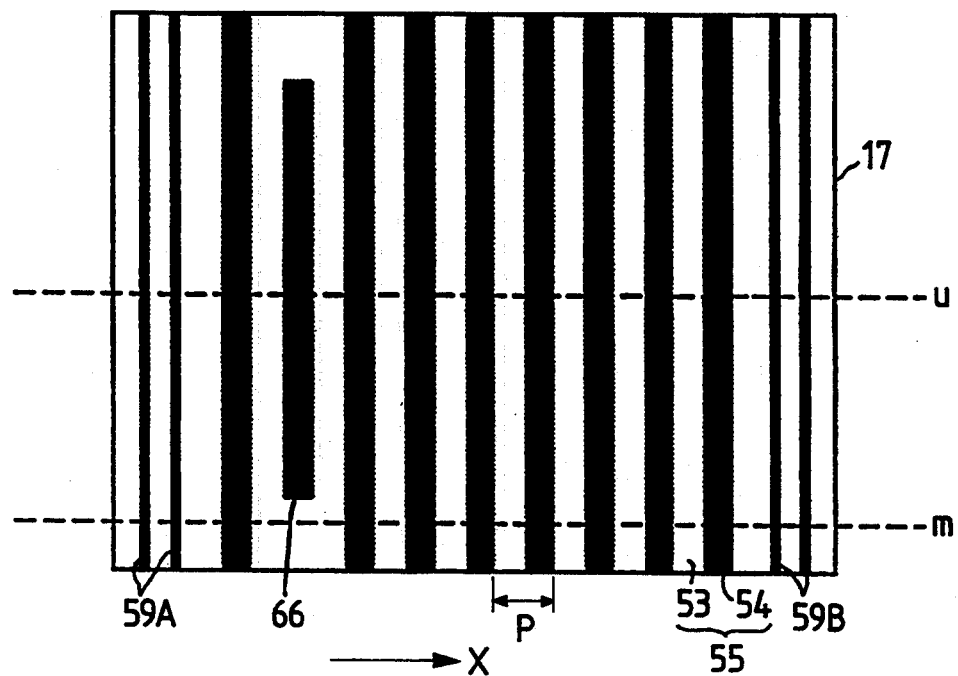
FIG. 14A is a view showing a lateral shift state of the image of the light-dark pattern shown in FIG. 13A.
Figure 14B:
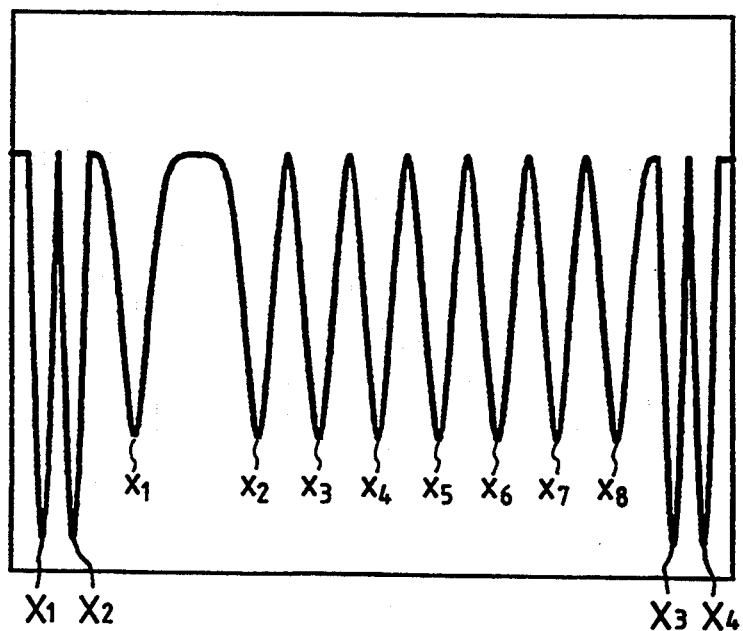
FIG. 14B is a chart showing an image pickup signal along a scan line m in FIG. 14A.

FIG. 14A shows an image focused on the image pickup surface of the two-dimensional CCD 17 when the surface of the shot area 51 on the wafer 1 is largely displaced from the best focal plane of the projection optical system 5, and FIG. 14B shows an image pickup signal along a scan line m in FIG. 14A. Assume that, in FIG. 14A, the grating pattern images 55 and the straight pattern image 66 as a non-repetitive portion are laterally shifted beyond $\pm P/2$ in the X direction with respect to the state shown in FIG. 13A.

In this case as well, the image pickup signal shown in FIG. 14B is differentiated to detect zero-crossing points, thereby obtaining positions $X_1$ to $X_4$ and $x_1$ to $x_8$ assuming minimal values corresponding to bottoms in the image pickup signal. Positions $q_1$ to $q_8$ are calculated with reference to the positions of the index mark images 59A and 59B from equations (5) and (6), and an interval $d_{ij}$ between positions $q_i$ and $q_j$ is calculated from equation (7). As a result, since an interval $d_{12}$ is twice other intervals $d_{ij}$ in FIG. 14B, the correction amount calculation means 19 (FIG. 1) detects that the positions $q_1$ and $q_2$ are the left and right fringe positions of the straight line pattern image 66. Based on this information, the correction amount calculation means 19 causes the drive means 4 to move the wafer 1 in the Z direction so as to shift the straight line pattern 66 in FIG. 14A in the X direction, thereby setting its position x' within a range of $\pm P/2$ with respect to the reference position $X_0$. Thereafter, when re-measurement is performed, since an image, as shown in FIG. 13A, is picked up, the level at each measurement point on the shot area 51 can be precisely measured from the lateral shift amounts of the fringes of the grating pattern images 55.

The moving amount, in the Z direction, of the wafer 1 at that time is separately measured and stored. When an average plane of the shot area 51 is caused to coincide with the best focal plane of the projection optical system 5, the stored moving amount need not be used.

In this manner, according to the present invention, after the position of the short straight line pattern image 66 as a non-repetitive portion is set near the center of the image pickup surface of the two-dimensional CCD 17, position detection is performed. For this reason, even when the surface of the shot area 51 on the wafer 1 is shifted from the best focal plane of the projection optical system 5 in the Z direction beyond $\pm P/(2\Omega)$, the distribution of levels of the shot area 51 can be precisely detected.

Note that the position, in the Z direction, of the wafer 1 (i.e., the position, in the X direction, of the straight line pattern image 66 on the image pickup surface) need not always be adjusted. That is, an approximate value of the position z in the Z direction at a position corresponding to the straight line pattern image 66 in the shot area 51 can be calculated as $x'/\Omega$ from the position x', in the X direction, of the straight line pattern image 66. If the lateral shift amount of the grating pattern image 55 closest to the straight line pattern image 66 (e.g., the lateral shift amount corresponding to the position $x_1$) is represented by x, the exact value of the position z is given by $(\delta x + nP)/\Omega$ (n is an integer). When a value n* of the integer n, which value can yield a value closest to $x'/\Omega$, is obtained, the exact value of the position z is given by $(\delta x + n^*P)/\Omega$. If the position obtained from the lateral shift amount of another portion of the grating pattern image 55 is represented by $z_i$, a value obtained by adding $(n^* \cdot P)/\Omega$ to the position $z_i$ is the exact position in the Z direction.

Various modifications of a periodic light-dark pattern including a non-repetitive portion to be projected onto the wafer 1 in the above-mentioned fifth embodiment will be described below. For the sake of simplicity, the following explanation will be given using a pattern image refocused on the image pickup surface of the two-dimensional CCD.

[First Modification]

Figure 15A:
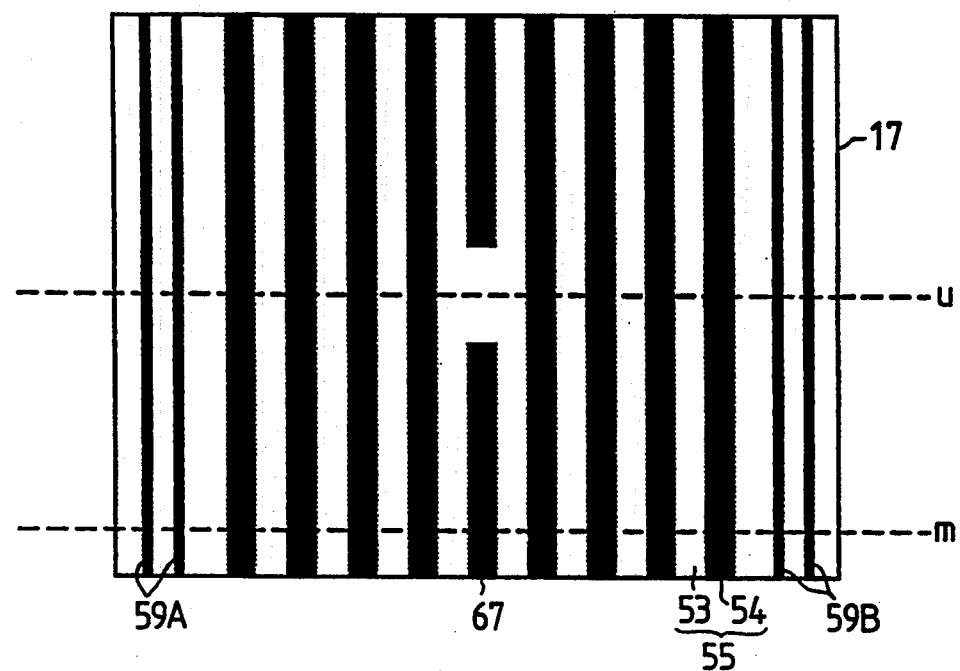
FIG. 15A is a view showing a first modification of the image of the light-dark pattern focused on the image pickup plane in the light-receiving system in FIG. 1 in the fifth embodiment.
Figure 15B:
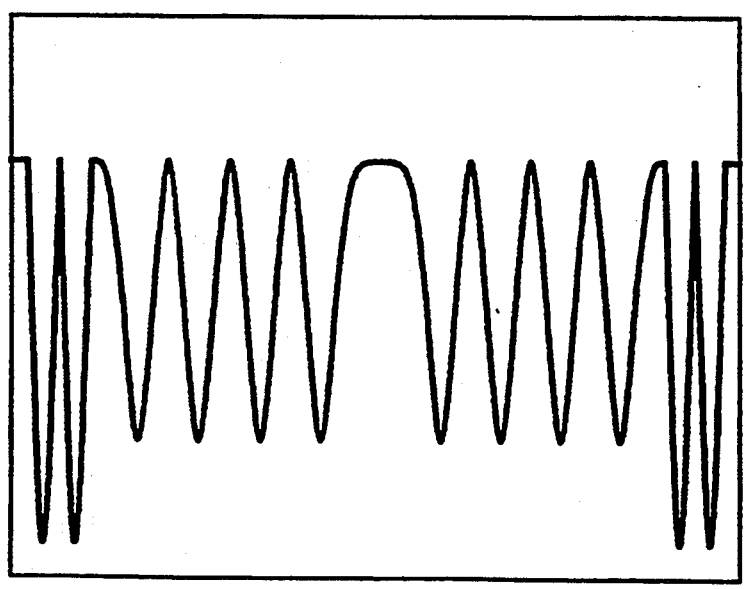
FIG. 15B is a chart showing an image pickup signal along a scan line u in FIG. 15A.

FIG. 15A shows an image of a light-dark pattern refocused on the image pickup surface of the two-dimensional CCD 17 according to this modification. As shown in FIG. 15A, the index mark images 59A and 59B are focused on the two end portions of the image pickup surface, and the grating pattern images 55 are refocused between these index mark images. Furthermore, a center-omitted straight line pattern image 67 as a non-repetitive portion is refocused at the central portion of the grating pattern images 55. Note that patterns excluding the index mark images 59A and 59B of the pattern images shown in FIG. 15A are projected onto the shot area on the wafer 1. FIG. 15B shows an image pickup signal along a scan line u in FIG. 15A.

According to this modification as well, the position of the center-omitted straight line pattern image 67 can be detected from the image pickup signal in FIG. 15B as in the fifth embodiment (FIG. 13A). When the detected position is set near the center of the image pickup surface (at almost the center between the two sets of index mark images), the position on the surface of the shot area can be precisely detected.

[Second Modification]

Figure 16A:
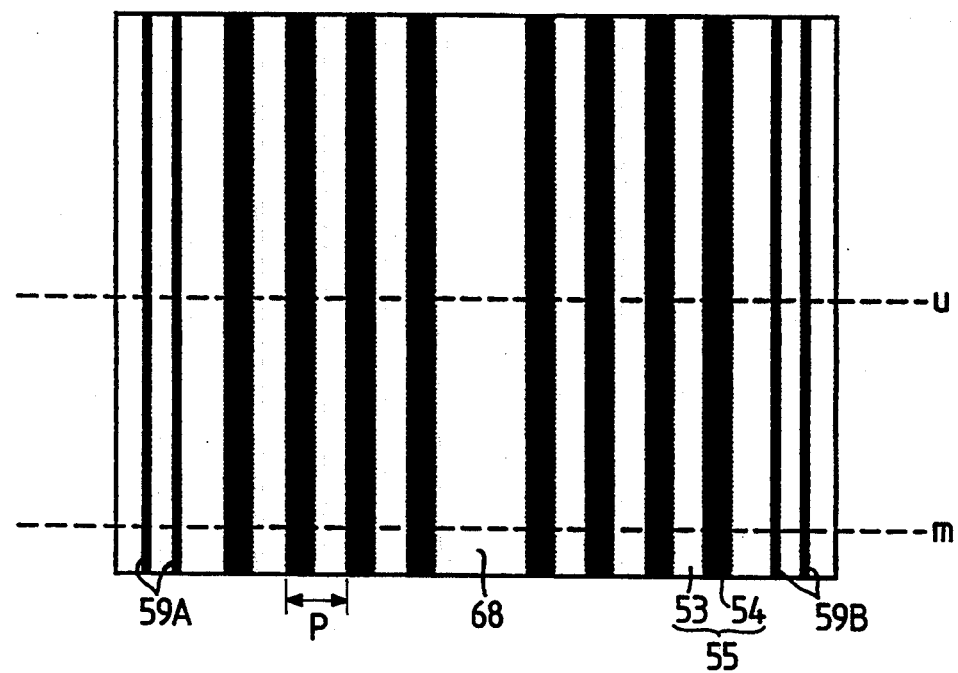
FIG. 16A is a view showing a second modification of the image of the light-dark pattern focused on the image pickup plane in the light-receiving system in FIG. 1 in the fifth embodiment.
Figure 16B:
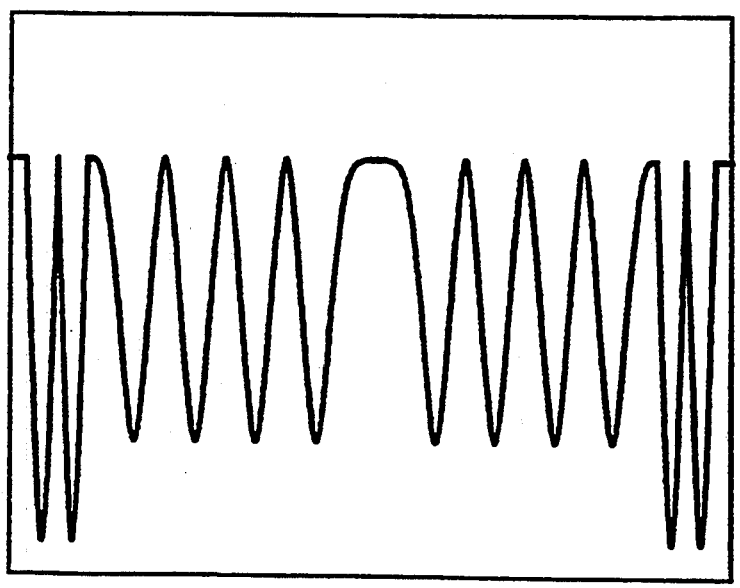
FIG. 16B is a chart showing an image pickup signal along a scan line u or m in FIG. 16A.

FIG. 16A shows an image of a light-dark pattern refocused on the image pickup surface of the two-dimensional CCD 17 according to this modification. As shown in FIG. 16A, the index mark images 59A and 59B are focused on the two end portions of the image pickup surface, and the grating pattern images 55 are refocused between these index mark images. In this modification, of a plurality of dark portions 54 of the grating pattern images 55, at least one dark portion (one dark portion in FIG. 16A) near the center is thinned out, thereby forming a wide light portion 58 as a non-repetitive portion. In this case, an image pickup signal along either a scan line m or u in FIG. 16A becomes, as shown in FIG. 16B. Therefore, according to this modification as well, when the level of the wafer 1 is adjusted, so that the light portion 58 is located at the central portion of the image pickup surface, the distribution of levels of the wafer 1 can be precisely detected even when the grating pattern images 55 are laterally shifted beyond $\pm P/2$.

[Third Modification]

Figure 17A:
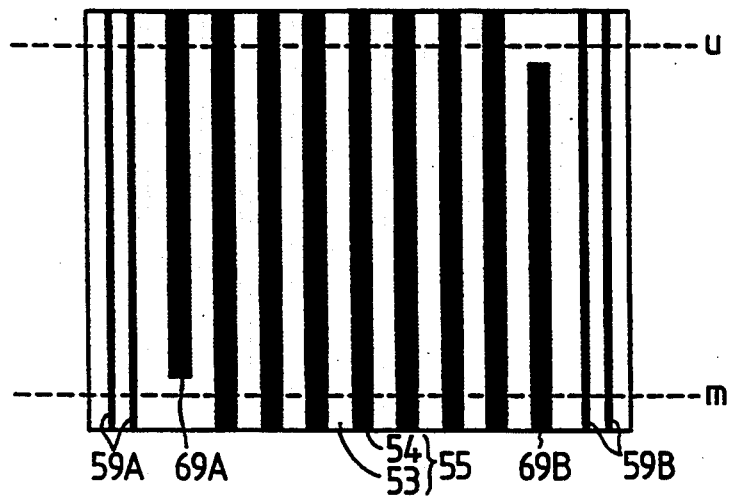
FIG. 17A is a view showing a third modification of the image of the light-dark pattern focused on the image pickup plane in the light-receiving system in FIG. 1 in the fifth embodiment.
Figure 17B:
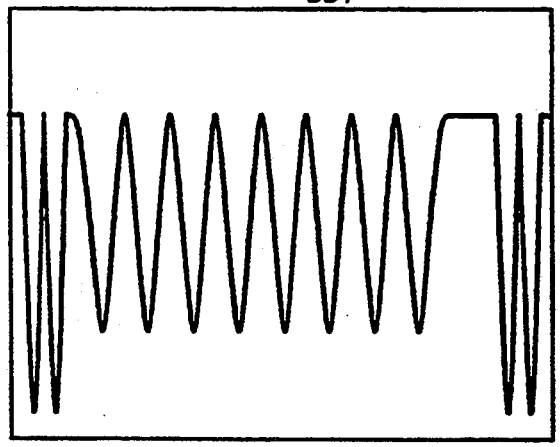
FIG. 17B is a chart showing an image pickup signal along a scan line u in FIG. 17A.
Figure 17C:
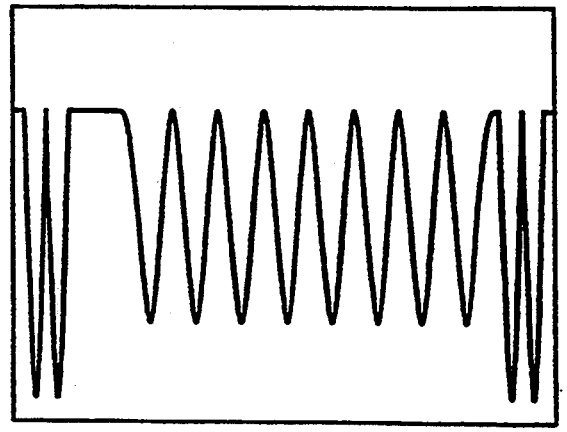
FIG. 17C is a chart showing an image pickup signal along a scan line m in FIG. 17A.

FIG. 17A shows an image of a light-dark pattern refocused on the image pickup surface of the two-dimensional CCD 17 according to this modification. As shown in FIG. 17A, the index mark images 59A and 59B are focused on the two end portions of the image pickup surface, and the grating pattern images 55 are refocused between these index mark images. In this modification, straight line pattern images 69B and 69A whose opposing end portions are shortened are formed as non-repetitive portions at the right and left end portions of the grating pattern images 55. The left-end straight line pattern image 69A in FIG. 17A is used as a reference when the grating pattern images 55 are entirely shifted to the right in the plane of drawing of FIG. 17A, and the right-end straight line pattern image 69B is used as a reference when the grating pattern images 55 are entirely shifted to the left in the plane of drawing of FIG. 17A. FIGS. 17B and 17C respectively show image pickup signals along scan lines u and m in FIG. 17A.

Figure 18A:
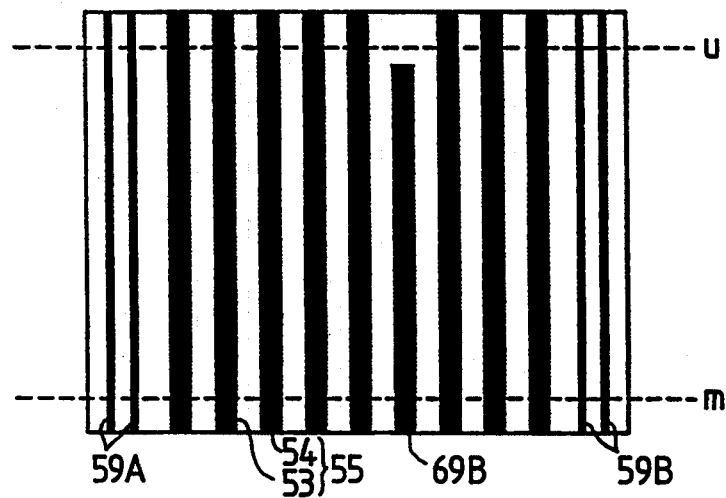
FIG. 18A is a view showing a state wherein the image of the light-dark pattern shown in FIG. 17A is shifted to the left.
Figure 18B:
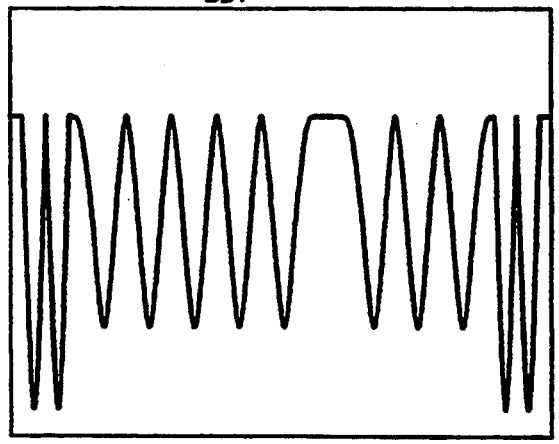
FIG. 18B is a chart showing an image pickup signal along a scan line u in FIG. 18A.
Figure 18C:
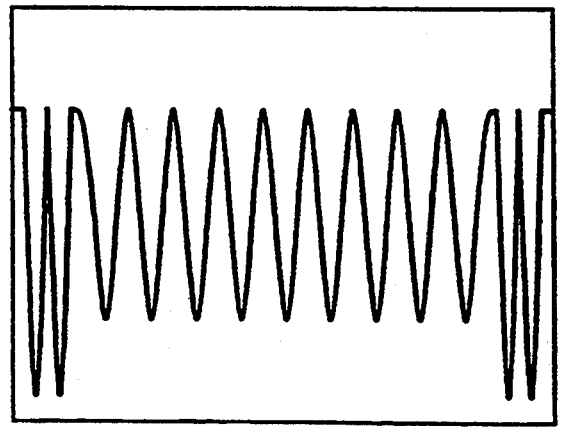
FIG. 18C is a chart showing an image pickup signal along a scan line m in FIG. 18A.
Figure 19A:
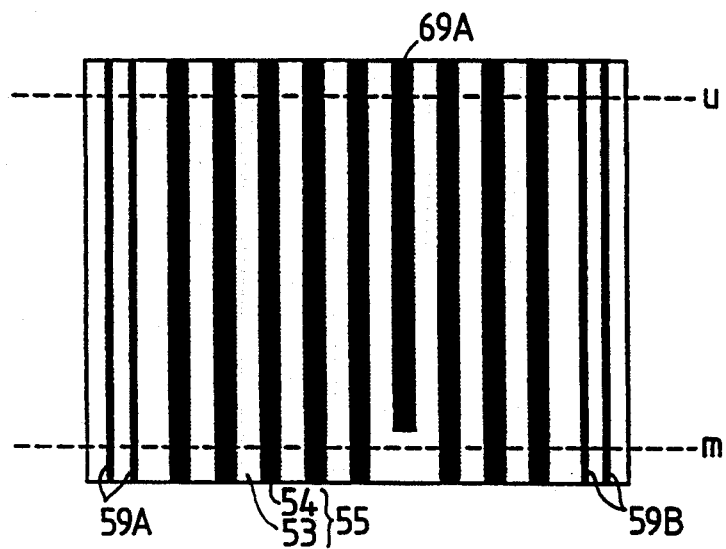
FIG. 19A is a view showing a state wherein the image of the light-dark pattern shown in FIG. 17A is shifted to the right.
Figure 19B:
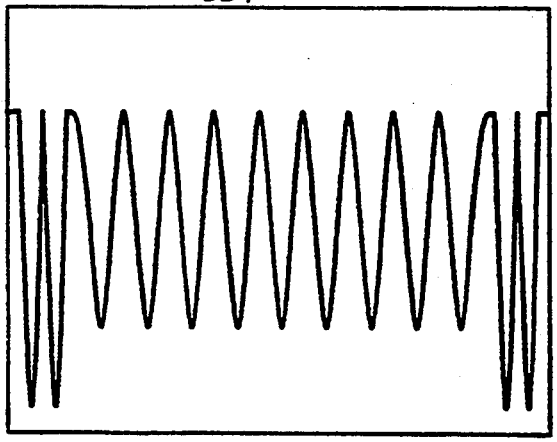
FIG. 19B is a chart showing an image pickup signal along a scan line u in FIG. 19A.
Figure 19C:
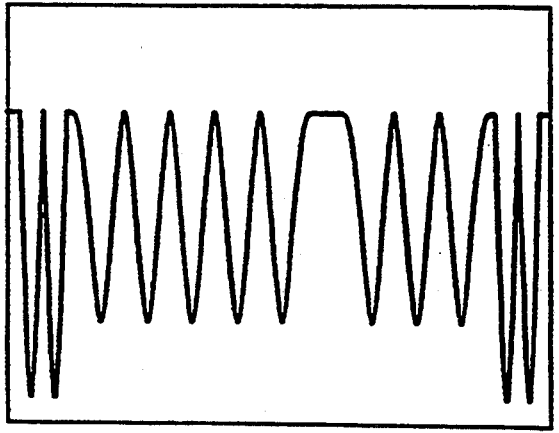
FIG. 19C is a chart showing an image pickup signal along a scan line m in FIG. 19A.

In this case, when the entire pattern image is shifted to the left in FIG. 17A, the straight line pattern image 69A falls outside the field of view (image pickup surface), but the straight line pattern image 69B falls within the field of view, as shown in FIG. 18A. FIGS. 18B and 18C respectively show image pickup signals along scan lines u and m in FIG. 18A, and the position of the straight line pattern image 69B can be detected from the image pickup signal along the scan line u shown in FIG. 18B in the same manner as in the fifth embodiment. On the other hand, when the pattern image is entirely shifted to the right in FIG. 17A, the straight line pattern image 69B falls outside the field of view, but the straight line pattern image 69A falls within the field of view, as shown in FIG. 19A. FIGS. 19B and 19C respectively show image pickup signals along scan lines u and m shown in FIG. 19A, and the position of the straight line pattern image 69A can be detected from the image pickup signal along the scan line m shown in FIG. 19C in the same manner as in the fifth embodiment.

In the third modification, since the non-repetitive portions are distributed on the right and left end portions of the grating pattern images 55, a lateral shift amount twice that obtained when the non-repetitive portion is arranged at the center of the grating pattern images 55 can be precisely detected. As can be apparent from FIGS. 12 and 17A, since the projected patterns corresponding to the straight line pattern images 69A and 69B as the non-repetitive portions are arranged outside the shot area 51 on the wafer 1, position detection can be performed on the entire shot area 51.

[Fourth Modification]

Figure 20A:
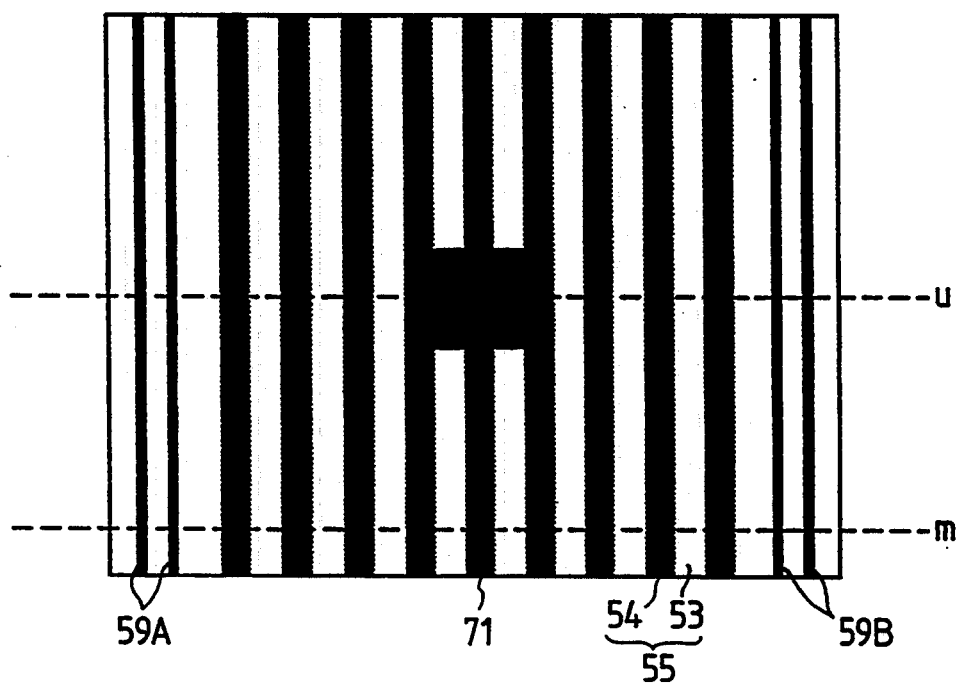
FIG. 20A is a view showing a fourth modification of the image of the light-dark pattern focused on the image pickup plane in the light-receiving system in FIG. 1 in the fifth embodiment.
Figure 20B:
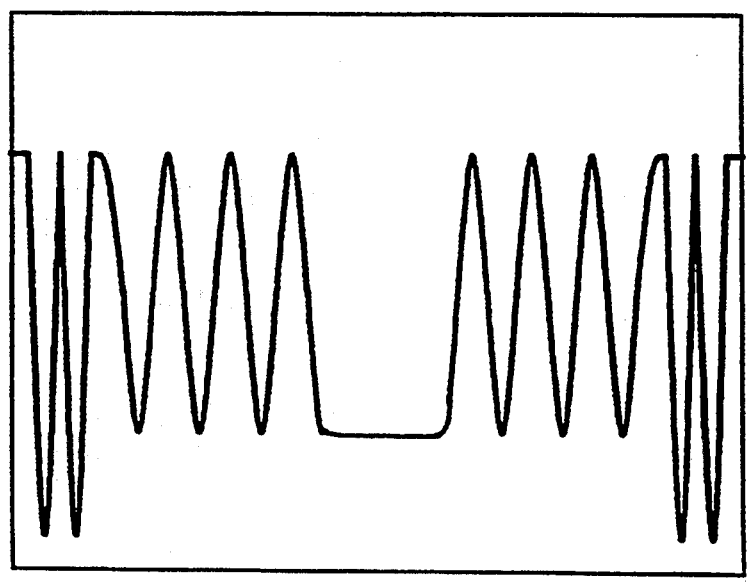
FIG. 20B is a chart showing an image pickup signal along a scan line u in FIG. 20A.

In the fifth embodiment and its modifications described above, a light portion of a light-dark pattern to be projected onto the wafer is widened to be distinguished from other portions. However, for example, a dark portion of a light-dark pattern may be widened to be distinguished from other portions. More specifically, FIG. 20A shows an image of a light-dark pattern refocused on the image pickup surface of the two-dimensional CCD 17 according to this modification. As shown in FIG. 20A, the index mark images 59A and 59B are focused on the two end portions of the image pickup surface, and the grating pattern images 55 are refocused between these index mark images. A pattern image 71 as a non-repetitive portion is formed by forming a dark portion on the central portion of straight line pattern images, which are located near the center of the grating pattern images 55, and consist of light portions sandwiching one dark portion therebetween. FIG. 20B shows an image pickup signal along a scan line u in FIG. 20A, and the position of the pattern image 71 can be detected from this image pickup signal. Similarly, in the above-mentioned other modifications, a non-repetitive portion can be formed by forming a dark portion on a portion of a light portion.

In FIG. 12, the edges 52a and 52b at the two end portions of the periodic light-dark pattern 52 may be regarded as non-repetitive portions. When the surface 1a of the wafer 1 coincides with the best focal plane of the projection optical system 5, the position of the prism 13' (or the diffraction grating 13) may be adjusted, so that images corresponding to the edges 52a and 52b are respectively located inside the index mark images 59A and 59B on the image pickup surface of the two-dimensional CCD 17 shown in FIG. 13A. Thus, the position on the shot area 51 can be precisely detected on the basis of the lateral shift amount of the image of the light-dark pattern 52.

The sixth embodiment of the present invention will be described below. Since a position detection apparatus of this embodiment has basically the same arrangement as that of the first embodiment (FIG. 1), a detailed description thereof will be omitted. In this embodiment, a light-dark pattern described in the third modification (FIG. 17) of the fifth embodiment is used. In this embodiment, the size (area) of the reference surface to be formed on the surface of the reference mark plate 29 to be used in calibration (i.e., detection of the reference position of a light-dark pattern image on the image pickup surface) of the plane level detection system is considerably smaller than the size (area) of the projection area of the light-dark pattern projected onto the wafer. For this reason, the reference surface to be used in this embodiment can be easily manufactured, and its flatness is very good.

The basic operation of this embodiment will be described below with reference to FIG. 21 and FIGS. 22A to 22C. In steps 101 and 102 in FIG. 21, calibration between the best focal plane (reticle image plane) of the projection optical system 5 and the surface of the reference mark plate 29 is performed (the details thereof will be described later). With this calibration, the surface (reference surface) of the reference mark plate 29 almost coincides with the best focal plane, and the positions (to be referred to as reference fringe positions hereinafter) of the images (light-dark fringes) of the light-dark pattern on the image pickup surface of the two-dimensional CCD are measured while maintaining the above-mentioned state (step 103).

Figure 21:
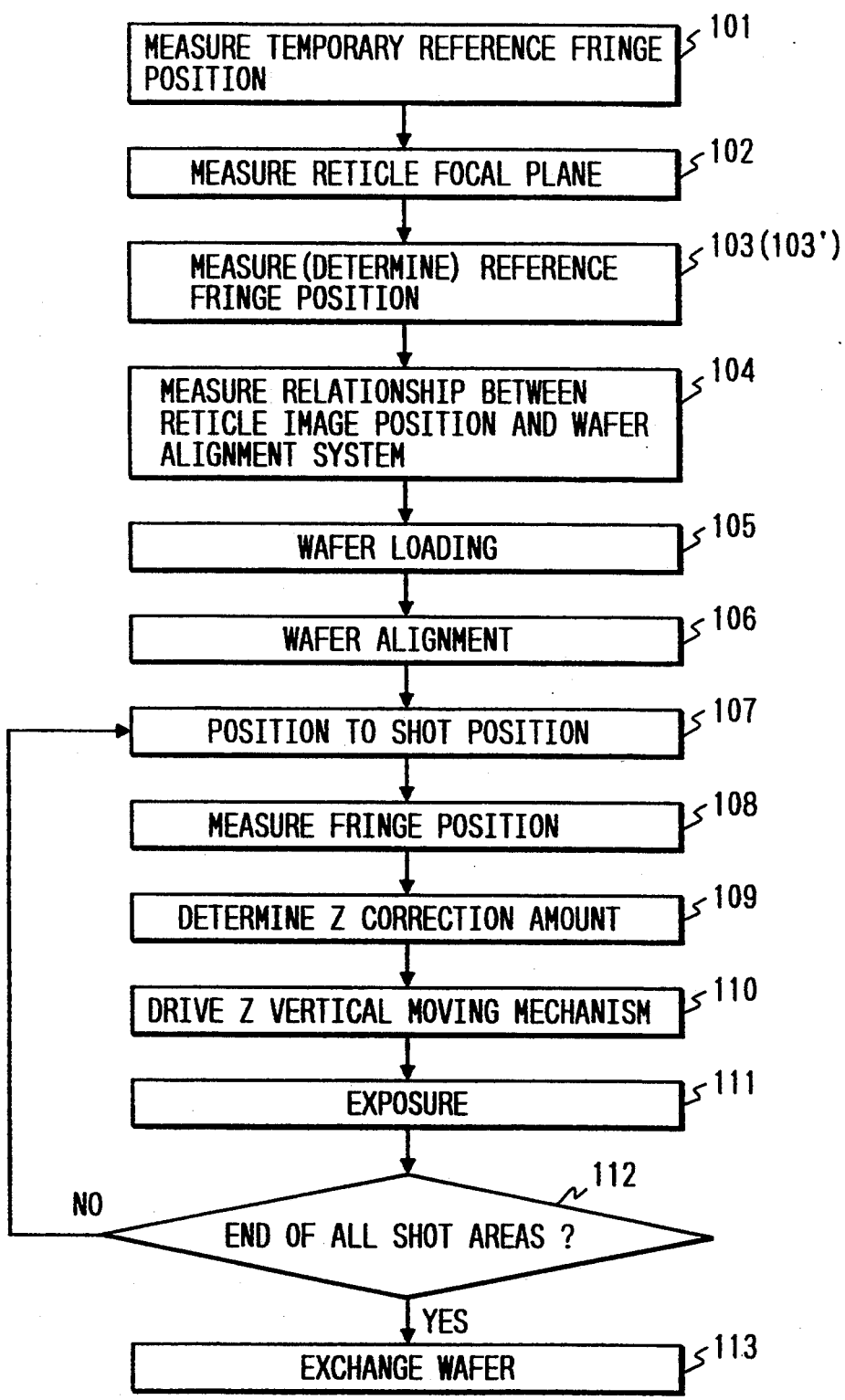
FIG. 21 is a flow chart showing an exposure operation in the sixth embodiment.
Figure 22A:
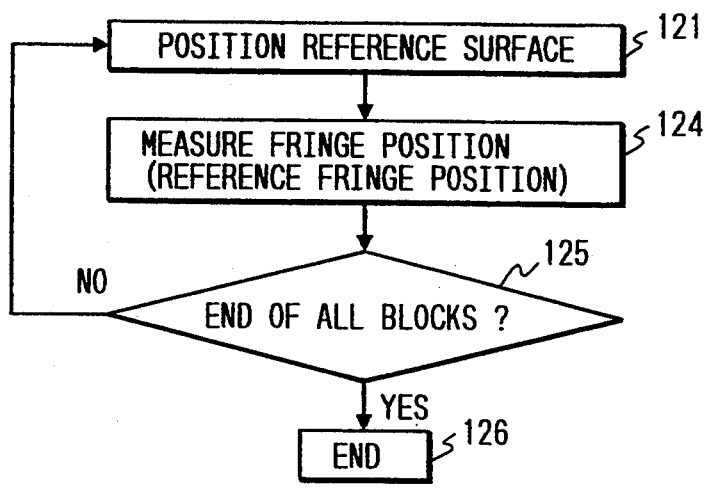
FIG. 22A is a flow chart showing a detailed operation in step 103 in FIG. 21.

FIG. 22A is a flow chart showing the details of step 103 in FIG. 21. As shown in FIG. 22A, in step 121, the X and Y stages 35X and 35Y are driven to move the surface of the reference mark plate 29 to a position within the projection area of the light-dark pattern 52. At this time, the reference mark plate 29 is located immediately below the projection optical system 5, and the light-dark pattern 52 from the light transmission system 41 is projected onto the surface of the plate 29.

Figure 23A:
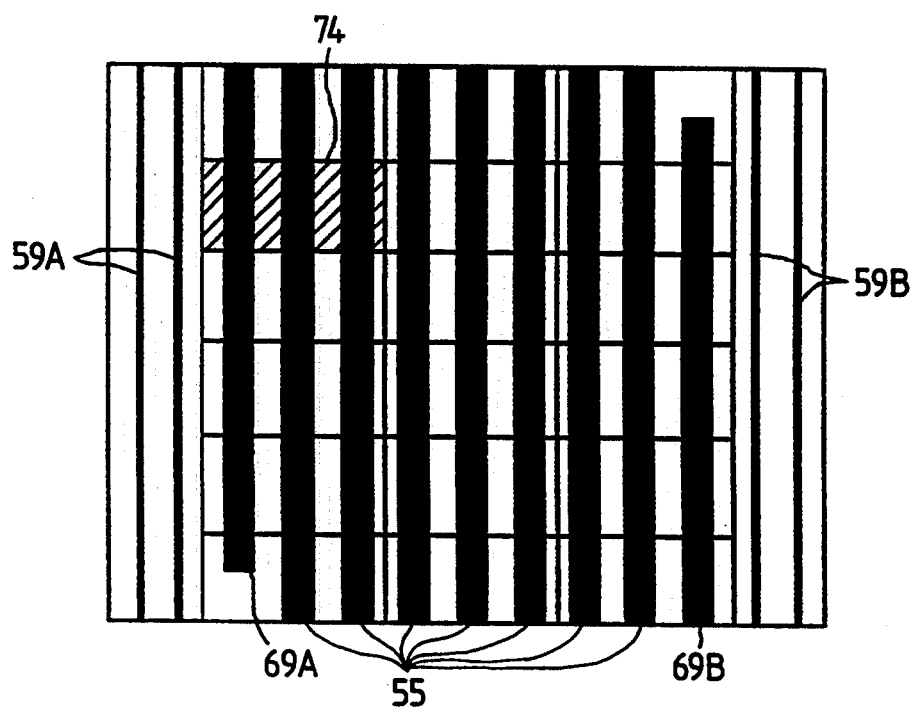
FIG. 23A is a view showing an image of a light-dark pattern focused on the image pickup plane in the light-receiving system in FIG. 1 in the sixth to eighth embodiments.

FIG. 23A shows the images 55 of the light-dark pattern reflected by the reference mark plate 29, and refocused on the image pickup surface of the two-dimensional CCD in the light-receiving system 42. In FIG. 23A, lines two-dimensionally dividing the image pickup surface into rectangles are drawn for the sake of convenience, and are not images. In FIG. 23A, the images 55 of the light-dark pattern are formed on the entire image pickup surface. In this case, the reference mark plate 29 has a sufficient size (area). However, when the size of the surface of the reference mark plate 29 is smaller than the total size of the pattern images 55 like in this embodiment, the range of the pattern image focused on the image pickup surface is only a portion (a block 74 in FIG. 23A) corresponding to the size of the surface (reference surface) of the reference mark plate 29. For the sake of simplicity, FIG. 23A shows the entire pattern image.

Figure 23B:
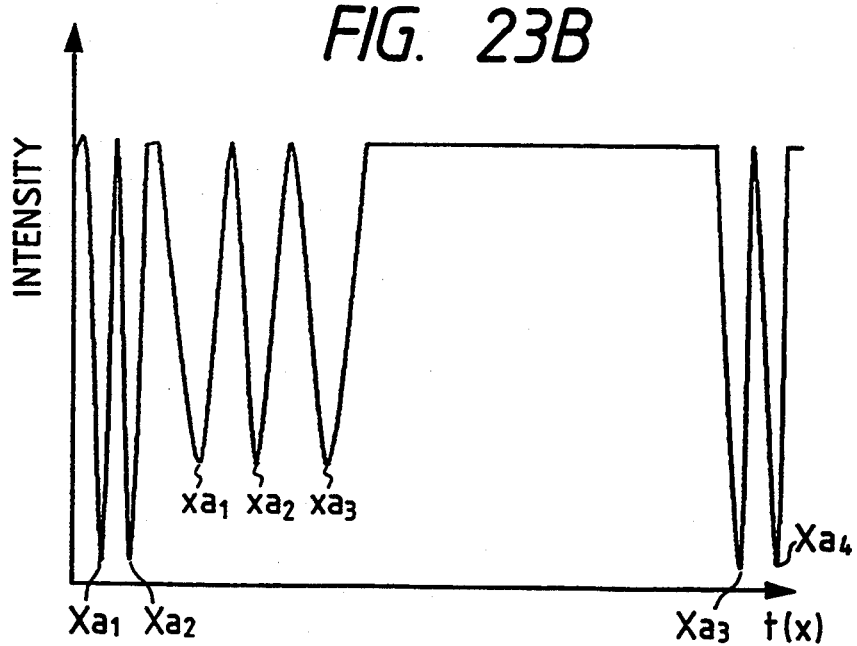
FIG. 23B is a chart showing an image pickup signal along a scan line crossing a block 74 in FIG. 23A.

Referring to FIG. 23A, in this embodiment, the images 55 of the light-dark pattern are divided into 18=6 (vertical)×3 (horizontal) blocks. In step 124 in FIG. 22A, the positions of the dark portions of the images 55 of the light-dark pattern in a single block 74 in FIG. 23A are calculated with respect to the index mark images 59A and 59B. More specifically, the image extraction means 45 extracts an image pickup signal along a scan line of a portion corresponding to the vertical length of the block 74 from the memory 44. FIG. 23B shows the extracted image pickup signal, and allows observation of two lower peaks (bottoms) corresponding to each of the index mark images 59A and 59B at the right and left end portions of the image pickup signal. The image processing means 46 detects coordinates $X_{a1}$ to $X_{a4}$, on the image pickup surface, of the bottoms of the index mark images. Furthermore, the image processing means 46 detects coordinates $x_{a1}$ to $x_{a3}$ indicating the centers of the dark lines of the light-dark pattern images 55 in the block 74, and determines a reference fringe position $S_1$ from the following equation using the coordinates $X_{a1}$ to $X_{a4}$:

$$S_1 = (x_{a1} + x_{a2} + x_{a3})/3 - (X_{a1} + X_{a2} + X_{a3} + X_{a4})/4 \qquad (8)$$

Note that image pickup signal portions corresponding to dark lines other than the three dark lines within the block 74 are omitted from FIG. 23B.

Figure 24A:
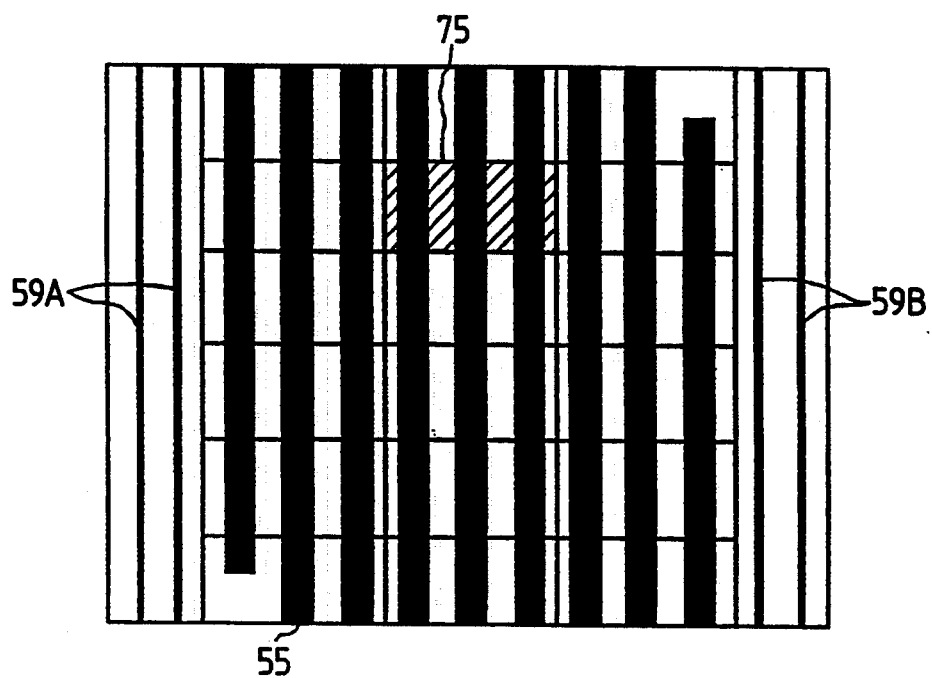
FIG. 24A is a view showing an image of a light-dark pattern focused on the image pickup plane in the light-receiving system in FIG. 1 when a reference member is moved within a projection area of the light-dark pattern.
Figure 24B:
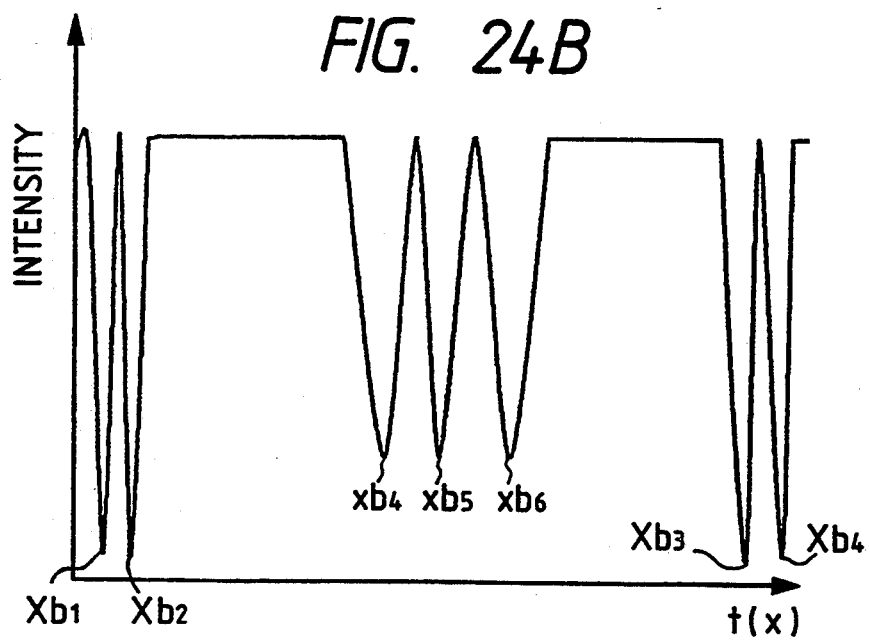
FIG. 24B is a chart showing an image pickup signal along a scan line crossing a block 75 in FIG. 24A.

The flow then returns to step 121 in FIG. 22A, and the X and Y stages 35X and 35Y are driven to move the reference mark plate 29 by a predetermined distance, thereby stepping the surface of the reference mark plate 29 overlapping the block 74 in FIG. 23A so far to a position overlapping a block 75 in FIG. 24A. Then, in step 124 in FIG. 22A, a reference fringe position $S_2$ is determined in the same manner as in the above-mentioned block 74. More specifically, FIG. 24B shows an image pickup signal along a scan line crossing the block 75 in FIG. 24A, and allows observation of two lower peaks (bottoms) corresponding to each of the index mark images 59A and 59B at the right and left end portions of the image pickup signal. The image processing means 46 detects coordinates $X_{b1}$ to $X_{b4}$, on the image pickup surface, of the bottoms of the index mark images, and coordinates $x_{b4}$ to $x_{b6}$ of the bottoms indicating the centers of the dark lines of the light-dark pattern images 55, and determines the reference fringe position $S_2$ from the following equation:

$$S_2 = (x_{b4} + x_{b5} + x_{b6})/3 - (X_{b1} + X_{b2} + X_{b3} + X_{b4})/4 \qquad (9)$$

Thereafter, steps 121 to 125 in FIG. 22A are similarly, repeated to obtain reference fringe positions $S_1$ to $S_{18}$ in the 18 blocks. Thus, the reference surface setting routine ends in step 126. These reference fringe positions $S_1$ to $S_{18}$ are stored in the correction amount calculation means 19.

Then, in step 104 in FIG. 21, the relationship (a so-called base line) between the position of a reticle image and the position of the alignment system 47 (FIG. 1) is measured, as will be described later. In step 105, the wafer 1 is placed on the wafer holder 28 on the Z stage 35Z, and in step 106, the position of each of a large number of shot areas 51 formed on the wafer 1 on the orthogonal coordinate system XY is measured using the alignment system 47. In step 107, the X and Y stages 35X and 35Y are driven in accordance with the coordinate position obtained in step 106 so as to move each shot area on the wafer 1 to a position overlapping the exposure area (the projection area of the pattern of the reticle 26) of the projection optical system 5.

Note that the position of the projected image of the pattern of the reticle 26 is measured in advance using the alignment microscope 43 (FIG. 1). Reference marks are patterned on the surface of the reference mark plate 29, and the alignment microscope 43 simultaneously observes the reference marks on the mark plate 29 and reticle marks formed on the reticle 26 under illumination light having the same wavelength as that of the exposure light IL. Thereafter, the reference marks on the reference mark plate 29 are aligned using the alignment system 47, thereby obtaining the relative position (base line) between the alignment system 47 and the reticle 26. These operations correspond to step 104 in FIG. 21.

In a state wherein one shot area on the wafer 1 is positioned to the exposure position, positions (to be simply referred to as "fringe positions" hereinafter) of the respective portions of the light-dark pattern images on the shot area are measured in step 108 in FIG. 21. At this time, the light-dark pattern 52 is projected onto the shot area, and a pattern image focused on the image pickup surface of the two-dimensional CCD in the light-receiving system 42 is as shown in FIG. 17A. An image pickup signal output from the two-dimensional CCD is stored in the memory 44 via the detection unit 18. The stored image pickup signal is extracted by the image extraction means 45 in units of 18 blocks, which are the same as those used in calculation of the reference fringe positions $S_1$ to $S_{18}$, and the extracted signals are supplied to the image processing means 46.

The image processing means 46 detects coordinates $X_1$ to $X_4$, on the image pickup surface, of the bottoms of the index mark images 59A and 59B present at the left and right end portions of the image pickup signal. Furthermore, the image processing means 46 divides the light-dark pattern images 55 in FIG. 17A into 18 blocks as in FIGS. 23A and 24A, detects coordinates $x_1$ to $x_3$ of bottoms indicating the centers of dark lines in the first block, and determines a fringe position $W_1$ of the first block from the following equation using the coordinates $X_1$ to $X_4$:

$$W_1 = (x_1 + x_2 + x_3)/3 - (X_1 + X_2 + X_3 + X_4)/4$$

Similarly, the image processing means 46 calculates fringe positions $W_2$ to $W_{18}$ of the second to 18th blocks. For example, the fringe position $W_{18}$ of the 18th block is calculated from the following equation using coordinates $X_1'$ to $X_4'$ of the bottoms corresponding to the index mark images and coordinates $x_7'$ to $x_9'$ of the bottoms of the light-dark pattern images 55 shown in FIG. 17C:

$$W_{18} = (x_7' + x_8' + x_9')/3 - (X_1' + X_2' + X_3' + X_4')/4$$

Then, in step 109 in FIG. 21, the fringe positions $W_1$ to $W_{18}$ calculated in step 108 are compared with the reference fringe positions $S_1$ to $S_{18}$, thereby obtaining lateral shift amounts $\Delta y_1$ to $\Delta y_{18}$ in units of 18 blocks, as follows:

$$\Delta y_i = W_i - S_i (i = 1, 2, \ldots, 18) \qquad (10)$$

When the lateral shift amounts $\Delta y_1$ to $\Delta y_{18}$ are substituted in the displacement y in equation (1), shift amounts $\Delta Z_1$ to $\Delta Z_{18}$, in the Z direction, of the current shot area on the wafer 1 from the surface (reference surface) of the reference mark plate 29 in units of blocks are obtained.

Assume an imaginary plane whose difference $\Delta Z$ from the surface of the reference mark plate 29 in the Z direction is expressed by the following equation:

$$\Delta Z = aX + bY + c \qquad (11)$$

Then, the parameters a to c representing the imaginary plane are determined by the least square approximation method on the basis of the actual 18 shift amounts, in the Z direction, of the current shot area on the wafer 1. If we let $(\alpha_1, \beta_1)$ to $(\alpha_{18}, \beta_{18})$ be the block positions in the XY plane corresponding to the previously calculated shift amounts $\Delta Z_1$ to $\Delta Z_{18}$ in the Z direction, the parameters a, b, and c need only be calculated to minimize the following equation. Note that the sum symbol $\Sigma$ represents a sum for a suffix i of from 1 to 18.

$$\Sigma(a\alpha_i + b\beta_i + c - \Delta Z_i)^2 \qquad (12)$$

When equation (12) is partial-differentiated with the parameters a, b, and c, and the partial differential results are taken as zero, values a*, b*, and c* of the parameters a, b, and c can be calculated. These values a*, b*, and c* can be expressed by the following equation:

$$\begin{pmatrix} a^* \\ b^* \\ c^* \end{pmatrix} = \begin{pmatrix} \Sigma\alpha_i & \Sigma\alpha_i\beta_i & \Sigma\alpha_i \\ \Sigma\alpha_i\beta_i & \Sigma\beta_i & \Sigma\beta_i \\ \Sigma\alpha_i & \Sigma\beta_i & 18 \end{pmatrix}^{-1} \begin{pmatrix} \Sigma\alpha_i & \Delta Z_i \\ \Sigma\beta_i & \Delta Z_i \\ \Sigma\Delta Z_i \end{pmatrix} \qquad (13)$$

$$\text{for } \Sigma = \sum_{i=1}^{18}$$

With this processing, actual drive amounts $\gamma_i$ (i=1, 2, 3) of the drive mechanisms 32 to 34 (FIG. 1) can be expressed by the following equation if the coordinate positions of the drive mechanisms 32 to 34 on the orthogonal coordinate system XY are represented by ($p_1$, $q_1$), ($p_2$, $q_2$), and ($p_3$, $q_3$):

$$\gamma_i = -(a^* p_i + b^* q_i) - c^* (i=1, 2, 3) \qquad (14)$$

In step 110 in FIG. 21, correction amounts $\gamma_1$, $\gamma_2$, and $\gamma_3$ are supplied to the drive mechanisms 32 to 34, and the drive mechanism 32 to 34 are operated according to these amounts, so that the surface of the current shot area of the wafer 1 coincides with the best focal plane of the projection optical system 5. Thereafter, exposure onto the shot area is performed in step 111. In step 112, it is checked if non-exposed shot areas remain on the wafer 1. If YES in step 112, the flow returns to step 107, and operations from alignment to exposure are repeated again. If it is determined in step 112 that exposure onto all shot areas on the wafer 1 is completed, the flow advances to step 113, and the wafer is exchanged with the next one.

An operation for causing the surface of the reference mark plate 29 to coincide with the best focal plane (reticle image plane) of the projection optical system 5 in steps 101 and 102 in FIG. 21 will be described below with reference to FIG. 25.

Figure 25:
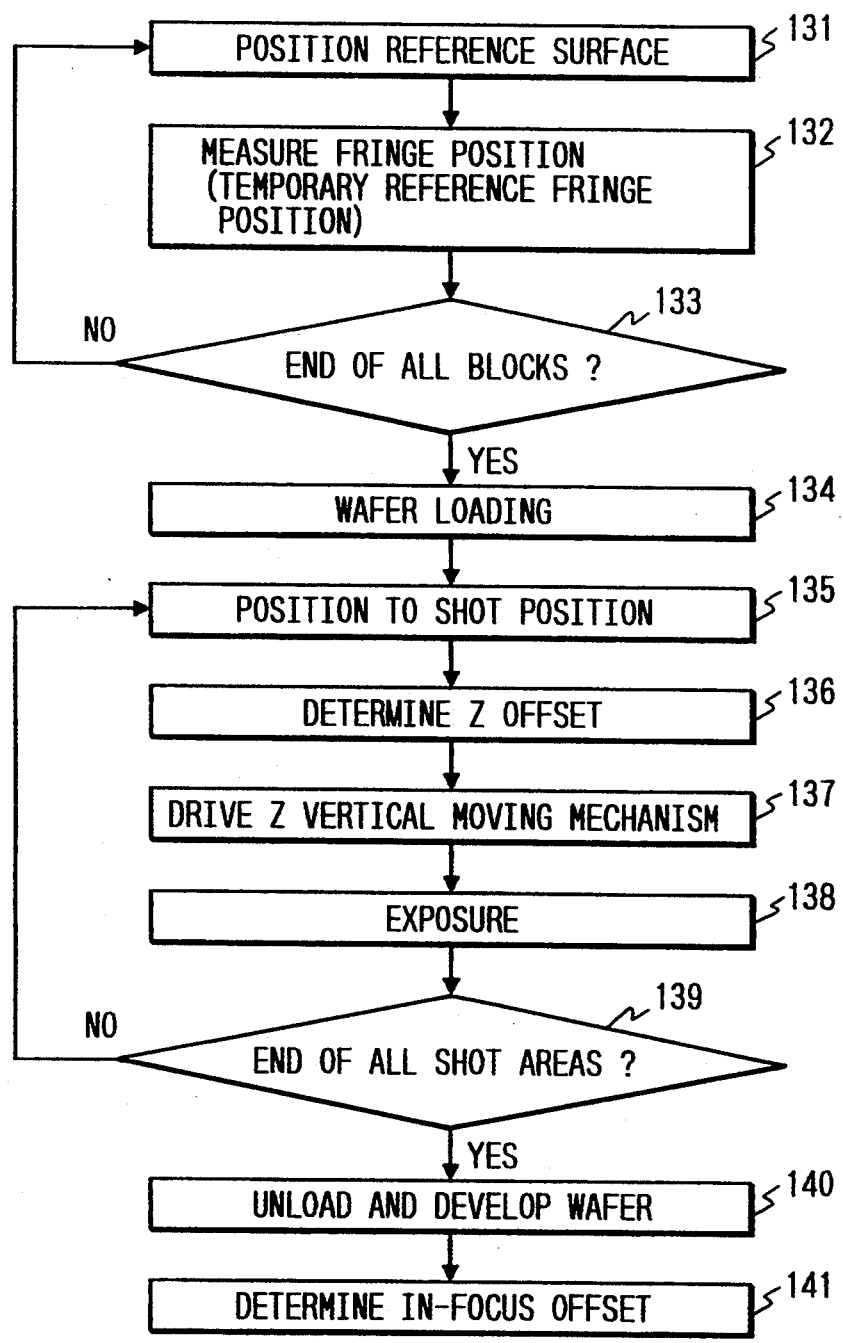
FIG. 25 is a flow chart showing detailed operations in steps 101 and 102 in FIG. 21.

In steps 131 to 133 in FIG. 25, the surface of the reference mark plate 29 is adjusted to a proper level, and temporary reference fringe positions $S_1^0$ to $S_{18}^0$ are calculated by the above-mentioned method. After the wafer 1 is placed on the wafer holder 28 in step 134, test exposure (test print) on the wafer 1 is performed as follows.

More specifically, a certain shot area on the wafer 1 is positioned to the exposure position in step 135, and the exposure surface of the wafer 1 is shifted by a predetermined Z offset with respect to the temporarily set surface position of the reference mark plate 29 in steps 136 and 137. In this state, exposure onto the shot area is performed in step 138. Thereafter, the flow returns to step 135 to position another shot area on the wafer 1 to the exposure position, and exposure is performed while giving a Z offset having a different amount to the positioned shot area. Therefore, these shot areas on the wafer 1 are exposed while being shifted by different amounts from the surface of the reference mark plate 29 in the Z direction.

More specifically, assuming that N shot areas on the wafer 1 are to be subjected to the test print, as the drive amounts $\gamma_i$ (i=1, 2, 3) of the drive mechanisms 32 to 34 on a jth shot area, a drive amount defined by the following equation in place of equation (14) is used.

$$\gamma_i = -(a^* p_i + b^* q_i) - c^* - (j - N/2)\epsilon (j=1, 2, \ldots, N) \qquad (15)$$

where j corresponds to the number of each shot area. If it is determined in step 139 that exposure onto all shot areas to be subjected to the test print is completed, the flow advances to step 140 to unload and develop the exposed wafer 1. Thereafter, in step 141, patterns (resist images) on the shot areas on the developed wafer 1 are evaluated in units of blocks corresponding to the above-mentioned 18 blocks on the image pickup surface. Assume that this evaluation reveals that, for example, a kth shot area coincides with the best focal plane of the projection optical system 5 in an ith block. In this case, the offset amount $(k-N/2)\cdot\epsilon$ in the Z direction in equation (15) corresponding to the kth shot area is a difference, in the Z direction, between the surface of the reference mark plate 29 and the best focal plane of the projection optical system 5. This difference is stored, thus completing calibration between the best focal plane and the surface of the reference mark plate 29.

Thereafter, step 103 in FIG. 21 is executed. In place of the above-mentioned method, the reference fringe positions $S_1^0$ to $S_{18}^0$ described above are directly used as the reference fringe positions $S_1$ to $S_{18}$, and the following equation may be used in place of equation (14). This operation corresponds to determination of the reference fringe positions in step 103.

$$\gamma_i = -(a^* p_i + b^* q_i) - c^* - (k - N/2)\epsilon \qquad (16)$$

Since an example of the method of measuring the best focus position utilizing the test print is disclosed in, e.g., U.S. Pat. No. 4,908,656, a detailed description thereof will be omitted.

The seventh embodiment of the present invention will be described below. In this embodiment, the content of step 109 (FIG. 21) of calculating the values a*, b*, and c* of the parameters in the sixth embodiment is different. More specifically, in the seventh embodiment, in place of calculating a sum for the suffix i of from 1 to 18 in equation (12), a sum of values corresponding to blocks designated in advance, e.g., i=1, 3, 5, 7, 9, 11, 13, 15, and 17 is calculated, and values a*', b*', and c*' of the parameters a, b, and c are calculated based on the sum. Other operations are the same as those in the sixth embodiment.

Alternatively, the following equation is used in place of equation (12). Note that the sum symbol $\Sigma$ represents a sum for the suffix i of from 1 to 18.

$$\Sigma k_i^2 (a\alpha_i + b\beta_i + c - \Delta Z_i)^2 \qquad (17)$$

In equation (17), the weighting coefficient $k_i$ is a real number ranging from 0 to 1, and varies depending on the suffix i. In the former example of the seventh embodiment, it is considered that weighting coefficients $k_1$, $k_3$, $k_5$, $k_7$, $k_9$, $k_{11}$, $k_{13}$, $k_{15}$, and $k_{17}$ are 1, and the remaining weighting coefficients $k_i$ are zero. Therefore, this example is included in the latter example. Depending on the values of the weighting coefficients $k_i$, the weighting coefficient of each block upon determination of an average plane of the shot area on the wafer 1 can be changed. These weighting coefficient values $k_i$ may be given in advance, or may be changed after the measurement values $\Delta Z_1$ to $\Delta Z_{18}$ are obtained.

More specifically, if the feature of the three-dimensional pattern in the shot areas distributed on the wafer 1 is already known, the weighting coefficient $k_i$ of a block corresponding to a portion to be aligned to the best focal plane of the projection optical system is set to be zero or a value near zero. Of the measurement values $\Delta Z_1$ to $\Delta Z_{18}$, if a certain measurement value $\Delta Z_i$ is abnormally different from other values, the weighting coefficient value $k_i$ corresponding to this measurement value is set to be zero or a value near zero during execution. Thus, an average plane of the shot area can be precisely determined without being influenced by a specific point of level within the shot area.

The eighth embodiment of the present invention will be described below. In the eighth embodiment, the operation for calibrating the surface of the reference mark plate 29 with respect to the reticle image plane in steps 101 and 102 in FIG. 21 in the sixth embodiment is performed in the operation for measuring the reference fringe positions in step 103.

Figure 22B:
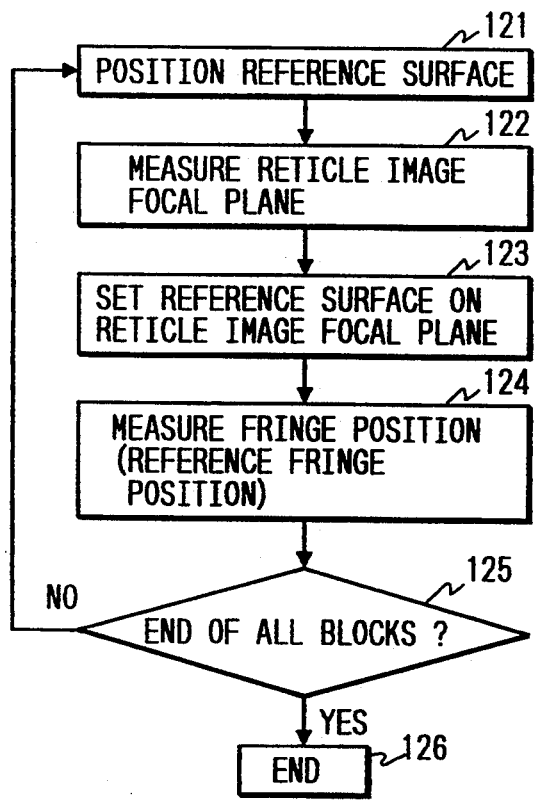
FIG. 22B is a flow chart showing an operation in the eighth embodiment.

FIG. 22B shows an operation corresponding to step 103 in FIG. 21 in the third embodiment. In step 121, the surface of the reference mark plate 29 is positioned to the projection position of the light-dark pattern as in the sixth embodiment. In step 122, the best focal plane (reticle image plane) of the projection optical system 5 is detected. More specifically, the best focal plane is detected as follows.

Figure 26:
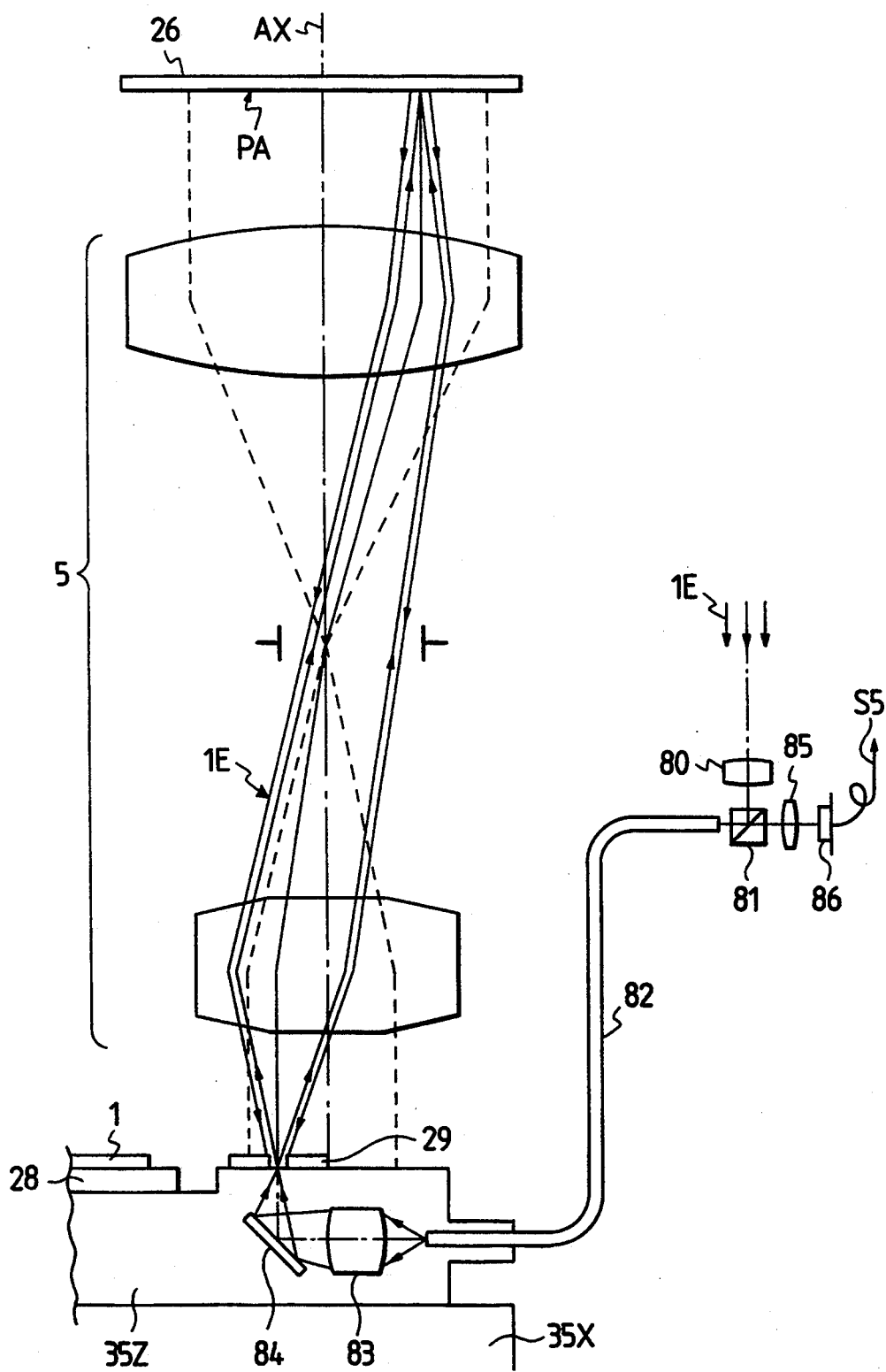
FIG. 26 is a view showing main part of a projection type exposure apparatus of the eighth embodiment.
Figure 27A:
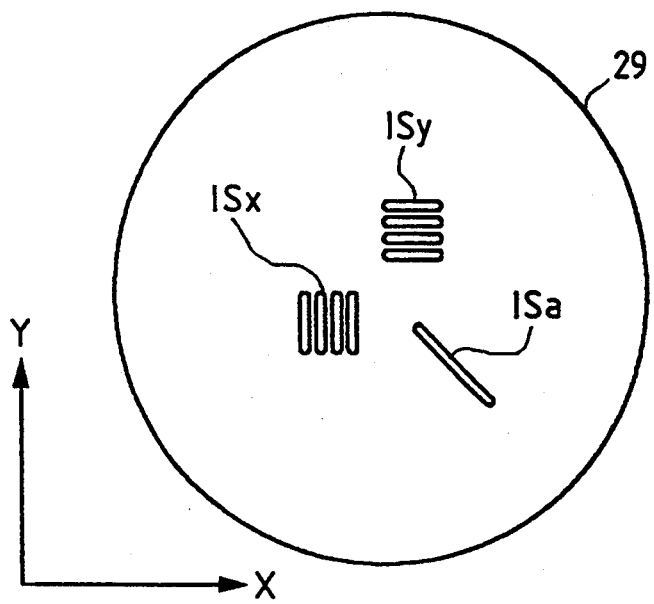
FIG. 27A is a view showing a slit pattern formed on the surface of a reference member in FIG. 26.

FIG. 26 shows main part of a reduction projection type exposure apparatus according to the eighth embodiment. The same reference numerals in FIG. 26 denote the same parts as in FIG. 1, and a detailed description thereof will be omitted. Referring to FIG. 26, illumination light IE having the same wavelength band as that of exposure light is caused to become incident on a beam splitter 81 via a condenser lens 80, and the illumination light IE reflected by the beam splitter 81 is focused on one end of a light guide 82. The other end of the light guide 82 is stored in the Z stage 35Z, and the illumination light IE emerging from the other end of the light guide 82 illuminates the reference mark plate 29 from its lower surface via a condenser lens 83 and a mirror 84. Slit patterns $IS_x$ formed in the X direction at a predetermined pitch, slit patterns $IS_y$ formed in the Y direction at a predetermined pitch, and a single slit pattern $IS_a$ extending in a direction crossing the X and Y directions at 45° are formed in a light-shielding film on the surface of the reference mark plate 29, as shown in FIG. 27A.

Referring back to FIG. 26, when the best focal plane of the projection optical system 5 is to be detected, the slit pattern images on the surface of the reference mark plate 29 are focused on a pattern area PA on the lower surface of the reticle 26 via the projection optical system 5. The illumination light IE reflected by the pattern area PA returns onto the slit patterns on the reference mark plate 29, and the illumination light IE passing through the slit patterns is incident on the beam splitter 81 via the mirror 83, the condenser lens 83, and the light guide 82. The illumination light IE transmitted through the beam splitter 81 is focused on the light-receiving surface of a photoelectric conversion element 86 by a condenser lens 85, and the photoelectric conversion element 86 outputs a detection signal S5 proportional to the intensity of light returning into the Z stage 35Z via the slit patterns on the reference mark plate 29.

Figure 27B:
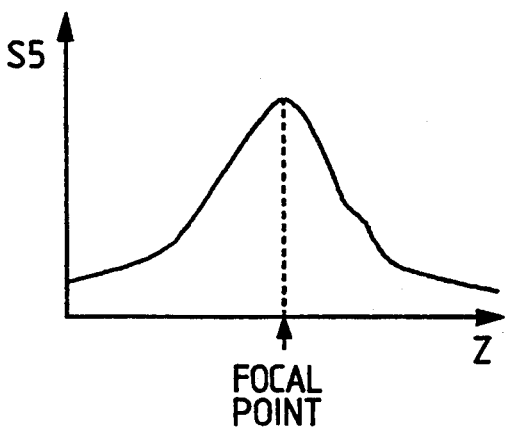
FIG. 27B is a chart showing a detection signal S5 in FIG. 26.

As shown in FIG. 27B, the detection signal S5 changes according to the position, in the Z direction, of the reference mark plate 29, and when the surface of the reference mark plate 29 coincides with the best focal plane of the projection optical system 5, the level of the detection signal S5 is maximized. Therefore, the Z coordinate corresponding to the maximum detection signal S5 represents an in-focus point. Note that the coordinate position, in the Z direction, of the Z stage 35Z can be detected by encoders attached to the drive mechanisms 32 to 34 (FIG. 1), the positions of the light-dark pattern images on the image pickup surface of the two-dimensional CCD, or the like. Therefore, even when the best focal plane of the projection optical system 5 is curved, the reference mark plate 29 is moved within the projection field of the projection optical system, and the in-focus points in the Z direction are detected at the respective positions, thereby precisely detecting the curved best focal plane of the projection optical system 5.

Furthermore, as shown in FIG. 26, after the reference mark plate 29 is set within the projection field of the projection optical system 5, the light-dark pattern 52 is projected from the light transmission system 41 onto the surface (reference surface) of the reference mark plate 29. At this time, assume that a pattern image shown in FIG. 23A is focused on the image pickup surface of the two-dimensional CCD in the light-receiving system 42. Also, assume that the slit patterns $IS_x$ and $IS_y$ shown in FIG. 27A are formed on the area on the reference mark plate 29 corresponding to the block 74 in the image pickup surface shown in FIG. 23A. In this case, the reference mark plate 29 is illuminated with illumination light IE from its lower surface, and the Z coordinate corresponding to the maximum detection signal S5 from the photoelectric conversion element 86 is detected, thereby obtaining an in-focus position of the region on the reference mark plate 29 corresponding to the block 74. Thus, the operation in step 122 in FIG. 22B is completed.

In step 123 in FIG. 22B, the surface of the reference mark plate 29 is moved to the in-focus point obtained in step 122, and in step 124, the positions (fringe positions) of the respective portions of the light-dark pattern images projected onto the reference mark plate 29 are measured in the same manner as in the sixth embodiment. The operations in steps 121 to 124 are performed for all 18 blocks of the image pickup surface in FIG. 23A, thus obtaining reference fringe positions $S_1$ to $S_{18}$. More specifically, in the eighth embodiment as well, even when the best focal plane of the projection optical system is curved, the reference positions of the light-dark pattern images can be precisely measured.

Figure 22C:
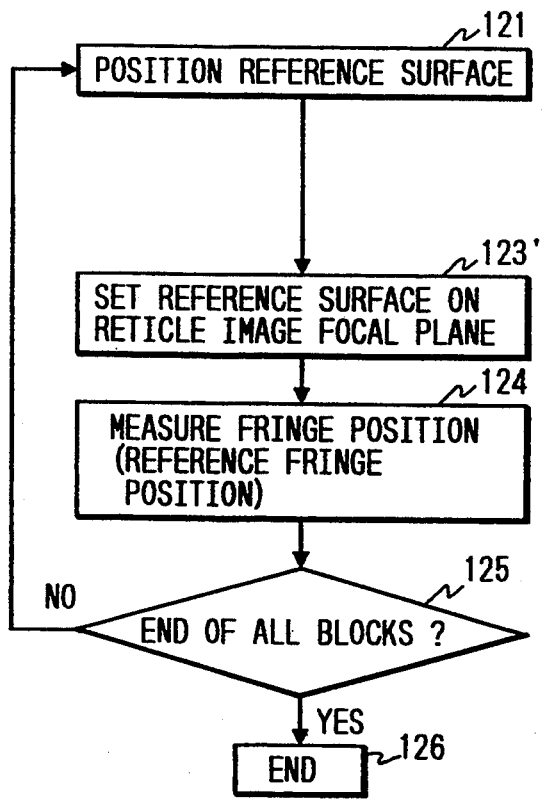
FIG. 22C is a flow chart showing an operation in the ninth embodiment.

The ninth embodiment of the present invention will be described below with reference to FIG. 22C. In the ninth embodiment, the reticle image plane measurement operation in step 122 in FIG. 22B in the eighth embodiment, and the positioning operation of the Z stage 35Z in step 123 are simultaneously performed. More specifically, FIG. 22C shows an operation for determining a reference fringe position according to the ninth embodiment. In step 123' in FIG. 22C, the operations in steps 122 and 123 in FIG. 22B are simultaneously executed.

More specifically, in step 123', the Z stage 35Z is positioned to a position, where the amount of light-passing through the slit patterns $IS_x$ and $IS_y$ of the reference mark plate 29 becomes maximum, by a so-called mountain-climbing method.

Figure 28:
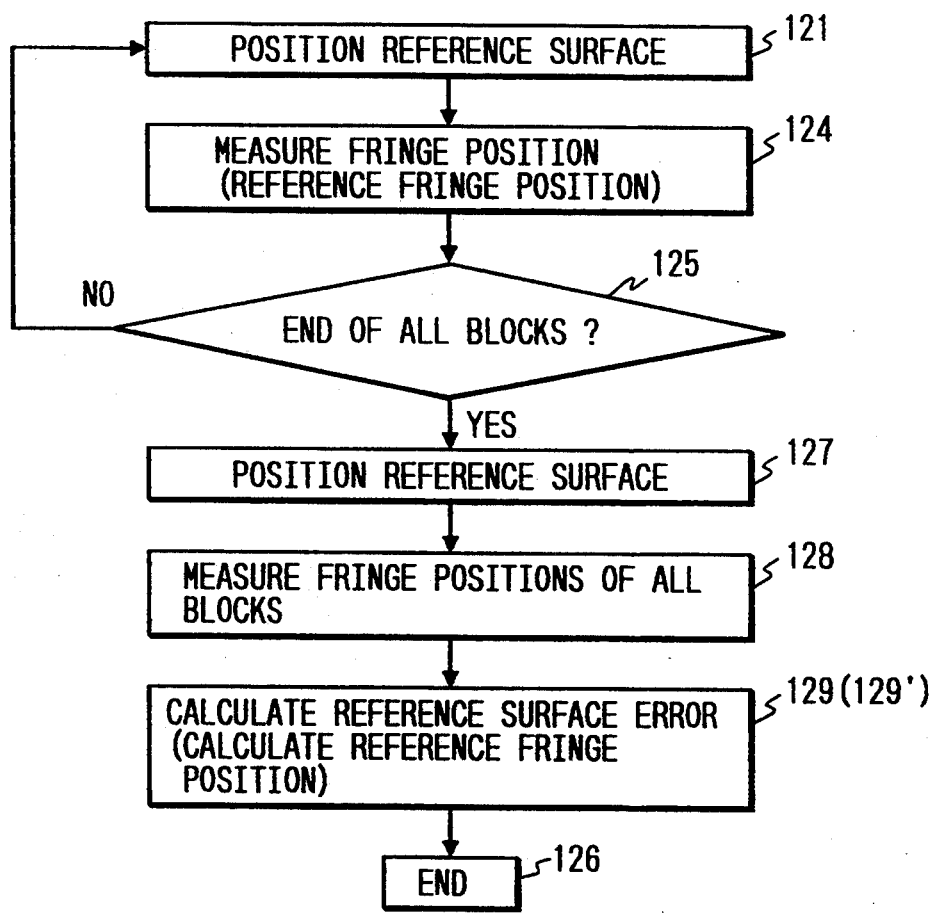
FIG. 28 is a flow chart showing main part of an operation of the tenth embodiment.

The 10th embodiment of the present invention will be described below with reference to FIG. 28. In the 10th embodiment, reference fringe positions $S_1$ to $S_{18}$ are measured in steps 121, 124, and 125 in FIG. 28. Thereafter, the flow advances to step 127, and the projection area of the light-dark pattern 52 is caused to overlap the surface of the reference mark plate 29. In this embodiment, the size of the surface (reference surface) of the reference mark plate 29 is equal to or larger than the size of the light-dark pattern 52, and in step 127, the reference mark plate 29 is positioned at a position where the entire light-dark pattern 52 falls within the surface of the reference mark plate 29.

In this state, fringe positions $S_1'$ to $S_{18}'$ of all 18 blocks in the image pickup surface shown in, e.g., FIG. 23A are measured in step 128. These fringe positions $S_1'$ to $S_{18}'$ are different from the original reference fringe positions $S_1$ to $S_{18}$ due to the inclination or a three-dimensional pattern of the entire reference mark plate 29. These differences are stored as offsets $\Delta S_1$ to $\Delta S_{18}$ (step 129). When the positions on the surface of the reference mark plate 29 are measured in the subsequent operation, the operation is started from step 127, and after the fringe positions $S_1'$ to $S_{18}'$ of all 18 blocks in the image pickup surface shown in, e.g., FIG. 23A are measured, the previously obtained offsets $\Delta S_1$ to $\Delta S_{18}$ are subtracted from these positions, thus determining the reference fringe positions $S_1$ to $S_{18}$ (step 129').

In the 10th embodiment, once differences between the positions of light-dark pattern images measured using a portion of the surface of the reference mark plate 29 and the positions of light-dark pattern images measured using the entire surface of the reference mark plate 29 are measured, the positions of the light-dark pattern images can be measured using the entire surface of the reference mark plate 29 in a single operation in the subsequent operations.

In the sixth to 10th embodiments described above, the image pickup surface is divided into 18 blocks. However, the number of blocks or the arrangement of blocks may be arbitrarily changed.

The 11th embodiment of the present invention will be described below. In the 11th embodiment, a three-dimensional pattern on the entire surface of the reference mark plate 29 (corresponding to the entire projection field of the projection optical system 5) is measured using some of detection blocks (e.g., the block 74 in FIG. 23A) on the image pickup surface of the two-dimensional CCD while sequentially moving the surface of the reference mark plate 29 within the projection field of the projection optical system 5, and the measurement result is stored as an offset amount. Furthermore, the surface of the reference mark plate 29 is aligned to the projection field of the projection optical system 5 using the position of the block 74 obtained in advance by the test print (steps 101 and 102 in FIG. 21) or the in-focus point detection operation (steps 122 and 123 in FIG. 22B) using the mechanism shown in FIG. 26, and the measured positions of the respective portions at that time are added with the corresponding offset amounts, thus obtaining displacement amounts. Thus, the influence of the three-dimensional pattern on the surface of the reference mark plate 29 can be eliminated.

In the 11th embodiment, the three-dimensional pattern on the surface of the reference mark plate 29 is measured in advance, and is used as an offset amount. Thus, the positions of light-dark pattern images can be measured in a single operation on the entire surface of the reference mark plate 29 as in the 10th embodiment.

In all the embodiments described above, the bottom positions of the image pickup signal are detected to obtain lateral shift amounts of light-dark pattern images. However, when the influence of a circuit pattern in the shot area is negligible or a system for moving the wafer during an image pickup operation like in the second embodiment is adopted, the peak positions of the image pickup signal may be detected. In the second to 11th embodiment, the lateral shift amounts of the pattern images 55 are obtained with reference to the index mark images 59A and 59B. However, the index mark images are not always necessary. More specifically, when the index marks are not used, a certain image pickup element of the two-dimensional CCD 17 may be used as a detection reference. In each of the above embodiments, in order to detect the phase shifts of the respective portions of the pattern images 55, the differentiation means 46A and the zero-crossing point detection means 46B shown in FIG. 2 are used. In place of these means, a method of directly detecting phase components by Fourier-transforming the image pickup signal may be adopted. Such a method can be realized in a software manner in the image processing means 46. In place of projecting a light-dark pattern onto the wafer using the reflection type diffraction grating 8 in FIG. 5 or 8, a diaphragm in which linear opening portions and light-shielding portions are alternately arranged may be used, and means for projecting the light-dark pattern is not particularly limited. Furthermore, in each of the above embodiments, the present invention is applied to a case wherein focal point detection for auto-focusing and inclination detection for leveling are performed. The present invention can also be applied to any other apparatuses for projecting a light-dark pattern onto a surface to be detected on which a certain pattern is drawn, and for obtaining the positions or interval of points on the surface to be detected.

What is claimed is:

1. An apparatus for detecting a position, in a predetermined direction normal to a substrate, of at least one measurement point in a detection area on said substrate, comprising:

means for projecting a light-dark pattern consisting of a repetitive pattern of light and dark portions in a direction normal to said predetermined direction onto substantially the entire detection area;

photoelectric detection means for detecting reflection light from said substrate, and outputting a photoelectric signal having a waveform corresponding to a contrast of an image in association with a direction of arrangement of said light-dark pattern;

detection means for detecting a position of a waveform representing a dark portion of said light-dark pattern corresponding to the measurement point in the waveform of the photoelectric signal; and measurement means for measuring the position, in the predetermined direction, of the measurement point based on a deviation between the detected waveform position and a predetermined reference position.

2. An apparatus according to claim 1, wherein said detection means includes means for specifying a waveform representing the dark portion from the waveform of the photoelectric signal, and waveform processing means for processing the specified waveform to detect a position thereof.

3. An apparatus according to claim 1, wherein said detection means detects positions of a waveform representing the dark portions of said light-dark pattern corresponding to a plurality of measurement points in the detection area, and said measurement means includes calculation means for calculating an inclination amount of the surface of the detection area with respect to a predetermined reference surface on the basis of deviations between the plurality of waveform positions and the reference position.

4. An apparatus for detecting a position, in a predetermined direction normal to a substrate, of at least one measurement point in a detection area on said substrate, comprising:

means for projecting a light-dark pattern onto at least a partial area including a measurement point of the detection area;

photoelectric detection means for receiving reflection light from said substrate, and outputting a photoelectric signal having a waveform corresponding to a contrast in association with a direction of arrangement of said light-dark pattern;

means for detecting a position of a waveform corresponding to a dark portion of said light-dark pattern in the partial area from the waveform of the photoelectric signal; and means for measuring the position in the predetermined direction at the measurement point on the basis of a deviation between the detected waveform position and a predetermined reference position.

5. A method of detecting a position, in a predetermined direction normal to a substrate, of at least one measurement point in a detection area on said substrate, comprising the steps of:

projecting a light-dark pattern onto the detection area, and receiving reflection light from said substrate so as to detect a waveform corresponding to a contrast of an image in association with a direction of arrangement of said light-dark pattern; and determining the position in the predetermined direction at the measurement point on the basis of a deviation between a position of the waveform representing a dark portion of said light-dark pattern corresponding to the measurement point in the detected waveform, and a predetermined reference position.

6. A method of detecting a position, in a predetermined direction normal to a substrate, of at least one measurement point in a detection area on said substrate, comprising the steps of:

projecting a light-dark pattern onto the detection area, and receiving reflection light from said substrate while moving said substrate in a direction normal to said predetermined direction so as to detect a waveform corresponding to a contrast of an image in association with a direction of arrangement of said light-dark pattern; and determining the position in the predetermined direction at the measurement point on the basis of a deviation between a position of the detected waveform and a predetermined reference position.

7. A method according to claim 6, wherein said light-dark pattern is a one-dimensional grating pattern, and said substrate is moved in a direction crossing a longitudinal direction of a dark or light portion of said light-dark pattern.

8. A method of detecting a position, in a predetermined direction normal to a substrate, of at least one measurement point in a detection area, formed with a predetermined pattern, on said substrate, comprising the steps of:

projecting a light-dark pattern onto the detection area, receiving reflection light from said substrate while moving said substrate in a direction normal to said predetermined direction so as to detect a waveform corresponding to a contrast of an image in association with a direction of arrangement of said light-dark pattern, and determining a first position in the predetermined direction at the measurement point on the basis of a deviation between a position of the detected waveform and a predetermined reference position;

projecting said light-dark pattern onto the detection area while said substrate stands still, receiving reflection light from said substrate so as to detect a waveform corresponding to a contrast of an image in association with a direction of arrangement of said light-dark pattern, and determining a second position in the predetermined direction at the measurement point on the basis of a deviation between a position of the detected waveform and the reference position; and determining the position in the predetermined direction at the measurement point by correcting the position in the predetermined direction determined while said substrate stands still in accordance with a difference between the first and second positions.

9. A method according to claim 8, wherein said substrate has a large number of detection areas, and the first and second positions are determined on at least one specific detection area of the large number of detection areas, and the position in the predetermined direction determined while said substrate stands still is corrected using at least one difference between the first and second positions on the detection areas other than the specific detection area.

10. An apparatus for detecting a position, in a predetermined direction normal to a substrate, of at least one measurement point in a detection area on said substrate, comprising:

means for projecting a light-dark pattern consisting of a repetitive pattern of light and dark portions in a direction normal to said predetermined direction onto the detection area, the repetitive pattern including a non-repetitive pattern in at least a portion thereof;

photoelectric detection means for receiving reflection light from said substrate, and outputting a photoelectric signal having a waveform corresponding to a contrast of an image in association with a direction of arrangement of said light-dark pattern;

means for detecting positions of a waveform corresponding to the repetitive pattern and the non-repetitive pattern in the waveform of the photoelectric signal; and means for measuring the position in the predetermined direction at the measurement point on the basis of deviations between the two detected waveform positions and a predetermined reference position.

11. An apparatus according to claim 10, wherein the non-repetitive pattern is formed by removing a portion of the repetitive pattern.

12. An apparatus according to claim 10, further comprising:

means for adjusting the position, in the predetermined direction, of said substrate, so that the waveform corresponding to the non-repetitive pattern in the waveform of the photoelectric signal is set at a predetermined position.

13. A method of projecting a light-dark pattern onto a detection area on a substrate, picking up an image of said light-dark pattern to detect a position of an image corresponding to a light or dark portion of said light-dark pattern, and detecting a position, in a predetermined direction normal to said substrate, of at least one measurement point in the detection area on the basis of the detected image position, comprising the steps of:

moving a reference member having a reflection surface having a predetermined area to a position within a projection area of said light-dark pattern, picking up an image of said light-dark pattern projected onto the reflection surface, and storing a position of the picked-up image as a first reference position;

moving said reference member by a predetermined amount within the projection area of said light-dark pattern, picking up the image of said light-dark pattern projected onto the reflection surface, and storing a position of the picked-up image as a second reference position; and positioning the detection area within the projection area of said light-dark pattern, picking up the image of the light-dark pattern projected onto the detection area, and detecting the position in the predetermined direction at the measurement point on the basis of a deviation between the picked-up image position and the first reference position or the second reference position.

14. An apparatus for detecting a position, in a predetermined direction normal to a substrate, of at least one measurement point in a detection area on said substrate, comprising:

an optical system for projecting a light-dark pattern onto at least one measurement point;

a photoelectric detector for receiving reflection light from said substrate, and outputting a signal corresponding to intensity of an image of said light-dark pattern;

a device for detecting a position of a dark portion of the image of said light-dark pattern from said signal; and a device for determining the position in the predetermined direction at the measurement point based on said detected position.

15. In an apparatus having a projection optical system for projecting a pattern formed on a mask onto a substrate to transfer said pattern onto each of plural local areas on said substrate, a device for detecting positions of said local areas in a direction of an optical axis of said projection optical system, said device comprising:

an optical system for projecting a light-dark pattern onto at least one measurement point in said local areas on said substrate;

a photoelectric detector for receiving reflection light from said substrate, and outputting a signal corresponding to an intensity of an image of said light-dark pattern;

a device for detecting a position of a dark portion of the image of said light-dark pattern from said signal; and a device for determining the position in the direction of the optical axis at said at least one measurement point based on said detected position.

16. An apparatus according to claim 15, further comprising:

a moving device for moving an image plane of said projection optical system and said substrate relatively to each other in accordance with the determined position.

17. An apparatus according to claim 16, wherein said moving device is moveable in the direction of the optical axis while holding said substrate and includes a stage inclinable to said image plane.

* * * * *